United States Patent
Park et al.

(10) Patent No.: US 9,520,535 B2
(45) Date of Patent: Dec. 13, 2016

(54) LIGHT EMITTING DEVICE AND LIGHTING SYSTEM

(71) Applicant: LG INNOTEK CO., LTD., Seoul (KR)

(72) Inventors: Chan Keun Park, Seoul (KR); Hyeong Jun Kim, Seoul (KR); Myung Hoon Jung, Seoul (KR); Jae Woong Han, Seoul (KR)

(73) Assignee: LG INNOTEK., LTD., Seoul (KR)

( * ) Notice: Subject to any disclaimer, the term of this patent is extended or adjusted under 35 U.S.C. 154(b) by 0 days.

(21) Appl. No.: 14/829,830

(22) Filed: Aug. 19, 2015

(65) Prior Publication Data

US 2016/0056338 A1 Feb. 25, 2016

(30) Foreign Application Priority Data

| Aug. 20, 2014 | (KR) | 10-2014-0108235 |
| Aug. 25, 2014 | (KR) | 10-2014-0111062 |
| Aug. 25, 2014 | (KR) | 10-2014-0111095 |

(51) Int. Cl.
*H01L 31/00* (2006.01)
*H01L 33/32* (2010.01)
(Continued)

(52) U.S. Cl.
CPC ......... *H01L 33/325* (2013.01); *H01L 33/0025* (2013.01); *H01L 33/025* (2013.01);
(Continued)

(58) Field of Classification Search
CPC .... H01L 33/325; H01L 33/06; H01L 33/0025; H01L 33/387; H01L 33/38; H01L 33/382; H01L 33/385; H01L 33/025; H01L 33/12; H01L 33/32
See application file for complete search history.

(56) References Cited

U.S. PATENT DOCUMENTS

| 6,337,493 B1 | 1/2002 | Tanizawa et al. |
| 8,669,585 B1 * | 3/2014 | Chen ...................... H01L 33/06 257/101 |

(Continued)

FOREIGN PATENT DOCUMENTS

| KR | 10-2012-0029252 A | 3/2012 |
| KR | 10-2013-0004852 * | 1/2013 ............. H01L 33/32 |

(Continued)

*Primary Examiner* — Victor A Mandala
*Assistant Examiner* — Colleen E Snow
(74) *Attorney, Agent, or Firm* — Birch, Stewart, Kolasch & Birch, LLP

(57) ABSTRACT

A light emitting device includes a first electrode, a first semiconductor layer disposed on the first electrode and including a first conductive dopant, a second semiconductor layer disposed on the first semiconductor layer and including the first conductive dopant having a doping concentration lower than a doping concentration of the first semiconductor layer, a third semiconductor layer disposed on the second semiconductor layer to adjust stress, a first conductive semiconductor layer on the third semiconductor layer, an active layer on the first conductive semiconductor layer, a second conductive semiconductor layer on the active layer; and a second electrode on the second conductive semiconductor layer, the third semiconductor layer has a doping concentration in a range between the doping concentration of the second semiconductor layer and a doping concentration of the first conductive semiconductor layer, and the doping concentration of the third semiconductor layer is increased toward the first conductive semiconductor layer.

20 Claims, 19 Drawing Sheets

(51) Int. Cl.
*H01L 33/02* (2010.01)
*H01L 33/00* (2010.01)
*H01L 33/06* (2010.01)
*H01L 33/12* (2010.01)

(52) U.S. Cl.
CPC .............. *H01L 33/06* (2013.01); *H01L 33/12* (2013.01); *H01L 33/32* (2013.01)

(56) References Cited

U.S. PATENT DOCUMENTS

| | | |
|---|---|---|
| 2008/0054248 A1 | 3/2008 | Chua et al. |
| 2008/0128678 A1* | 6/2008 | Lee ................. B82Y 20/00 257/13 |
| 2009/0016397 A1* | 1/2009 | Terano ............. B82Y 20/00 257/98 |
| 2012/0037881 A1 | 2/2012 | Kim et al. |
| 2012/0049157 A1 | 3/2012 | Nago et al. |
| 2012/0138890 A1* | 6/2012 | Shioda ................. H01L 33/40 257/13 |
| 2012/0228580 A1* | 9/2012 | Wang ................. H01L 27/156 257/13 |
| 2012/0326169 A1* | 12/2012 | Sakai ................. B82Y 20/00 257/79 |
| 2013/0082280 A1* | 4/2013 | Lin ..................... H01L 33/22 257/77 |
| 2013/0307001 A1* | 11/2013 | Lee ..................... H01L 33/12 257/94 |
| 2014/0158980 A1* | 6/2014 | Shur ................. H01L 21/02518 257/13 |
| 2014/0166980 A1* | 6/2014 | Goda ................. H01L 33/06 257/13 |

FOREIGN PATENT DOCUMENTS

| | | |
|---|---|---|
| KR | 10-2013-0065095 A | 6/2013 |
| KR | 10-2013-0066870 A | 6/2013 |
| KR | 10-2013-0141945 A | 12/2013 |
| KR | 10-2014-0092605 A | 7/2014 |

* cited by examiner

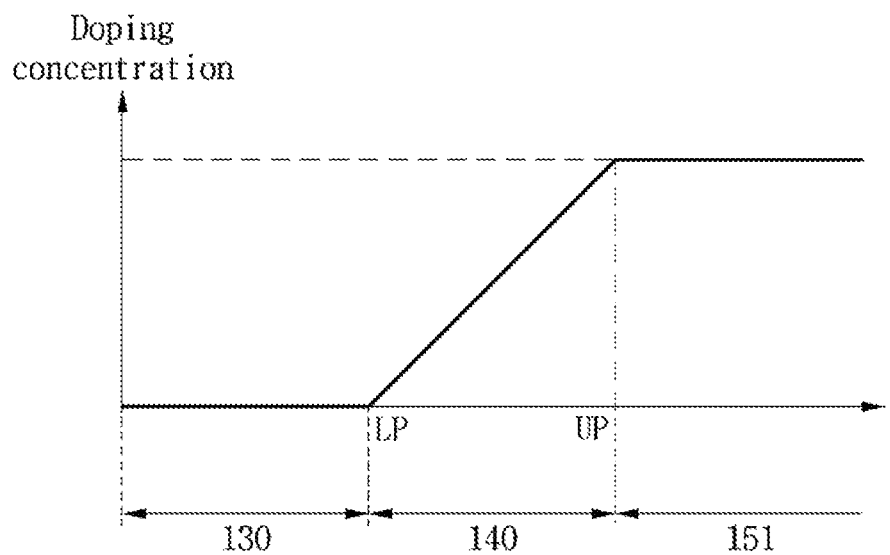
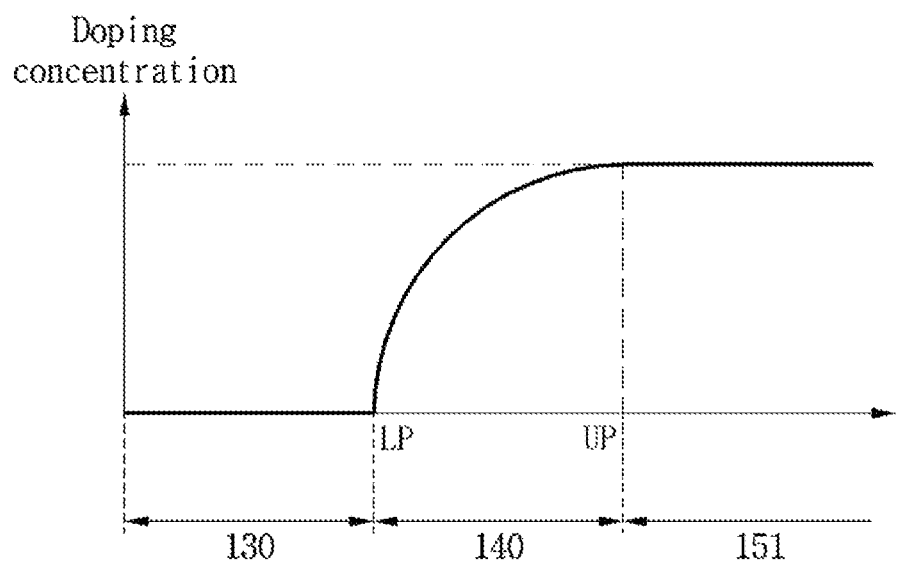

LIGHT EMITTING DEVICE AND LIGHTING SYSTEM

CROSS-REFERENCE TO RELATED APPLICATION

This application claims under 35 U.S.C. §119 to Korean Patent Application No. 10-2014-0108235 (filed Aug. 20, 2014), Korean Patent Application No. 10-2014-0111062 (filed Aug. 25, 2014), and Korean Patent Application No. 10-2014-0111095 (filed Aug. 25, 2014), which are hereby incorporated by references in there entireties.

BACKGROUND

A light emitting device includes a P-N junction diode having a characteristic of converting electrical energy into light energy. The light emitting device may be produced using compound semiconductors belonging to group III and V on the periodic table. The light emitting device can represent various colors by adjusting the composition ratio of the compound semiconductors.

When forward voltage is applied to the light emitting device, electrons of an N layer are combined with holes of a P layer, so that energy may be diverged corresponding to band gap energy between a conduction band and a valance band. The energy is mainly emitted in the form of heat or light. In the case of the light emitting device, the energy is diverged in the form of light.

For example, a nitride semiconductor represents high thermal stability and wide band gap energy so that the nitride semiconductor has been spotlighted in the field of optical devices and high-power electronic devices. In particular, blue, green, and ultraviolet (UV) light emitting devices employing the nitride semiconductor have already been commercialized and extensively used.

In particular, as the UV light emitting device is increasingly utilized, the demand for the UV light emitting device is increased, so that the interest in the UF light emitting device is raised.

However, a light emitting structure of the UV light emitting device may be formed of a material having compositions different from those of other nitride light emitting devices. Accordingly, when other structures (for example, a dislocation control layer, a strain control layer, a current spreading layer, and the like) provided in a light emitting device to emit lights of different light emitting bands are applied to the UV light emitting device except for the light emitting structure, the UV light emitting device may produce an unexpected adverse effect instead of the effects of other nitride light emitting devices.

Meanwhile, a light emitting device may be classified into a lateral type and a vertical type according to the positions of an electrode.

According to the vertical type of the light emitting device of the related art, when a growth substrate is removed and the electrode is connected, operating voltage (VF) may be affected or light loss (Po) may be caused according to the compositions of a semiconductor layer making contact with the electrode.

Meanwhile, according to a light emitting device having a conventional structure, if a quantity of injected current is increased, light emission efficiency may be degraded because hole injection efficiency is lower than electron injection efficiency in a light emission layer. In order to solve the above problem, there is required the development of a technology that holes can be effectively moved from a p layer to an n layer in the light emission layer, so that the holes can be uniformly distributed in the light emission layer, thereby allowing all quantum wells of the light emission layer to participate in light emission.

BRIEF SUMMARY

The embodiment provides a light emitting device capable of improving light emission efficiency and a lighting system.

According to the embodiment, there is provided a light emitting device including a first electrode, a first semiconductor layer disposed on the first electrode and including a first conductive dopant, a second semiconductor layer disposed on the first semiconductor layer and including the first conductive dopant having a doping concentration lower than a doping concentration of the first semiconductor layer, a third semiconductor layer disposed on the second semiconductor layer to adjust stress, a first conductive semiconductor layer on the third semiconductor layer, an active layer on the first conductive semiconductor layer, a second conductive semiconductor layer on the active layer, and a second electrode on the second conductive semiconductor layer. The third semiconductor layer has a doping concentration in a range between the doping concentration of the second semiconductor layer and a doping concentration of the first conductive semiconductor layer, and the doping concentration of the third semiconductor layer is increased toward the first conductive semiconductor layer.

According to the embodiment, there is provided a light emitting device including a first conductive semiconductor layer, an active layer on the first conductive semiconductor layer, an $Al_pGa_qIn_{1-p-q}N$ layer ($0<p\le1$ and $0\le q\le1$) on the active layer, an undoped $Al_tGa_{1-t}N$ layer ($0\le t<1$) on the $Al_pGa_qIn_{1-p-q}N$ layer ($0<p\le1$ and $0\le q\le1$), and a second conductive semiconductor layer on the undoped $Al_tGa_{1-t}N$ layer ($0\le t<1$).

According to the embodiment, there is provided a light emitting device including a first conductive semiconductor layer, an active layer on the first conductive semiconductor layer, an $Al_pGa_qIn_{1-p-q}N$ layer ($0<p\le1$ and $0\le q\le1$) on the active layer, an AlGaN based superlattice layer on the $Al_pGa_qIn_{1-p-q}N$ layer ($0<p\le1$ and $0\le q\le1$), and a second conductive semiconductor layer on the AlGaN based superlattice layer.

BRIEF DESCRIPTION OF THE DRAWINGS

FIG. 2 is a graph showing doping concentrations of a second semiconductor layer, a third semiconductor layer, and a first conductive semiconductor layer according to the first embodiment.

FIG. 3 is a graph showing doping concentrations of a second semiconductor layer, a third semiconductor layer, and a first conductive semiconductor layer according to the second embodiment.

DETAILED DESCRIPTION OF THE EMBODIMENTS

Hereinafter, a light emitting device and a lighting system according to the embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
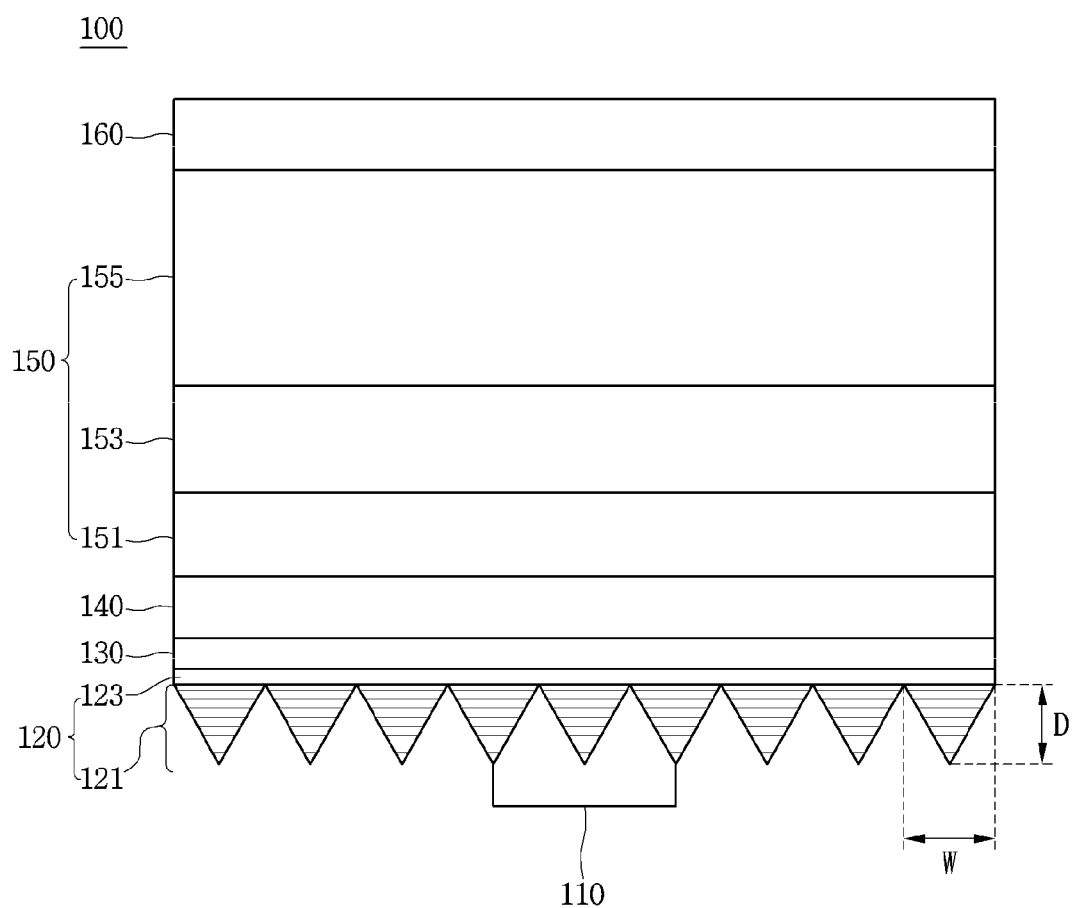
FIG. 1 is a sectional view showing a light emitting device according to the first embodiment.

FIG. 1 is a sectional view showing a light emitting device 100 according to the first embodiment.

The light emitting device 100 according to the first embodiment may include a first electrode 110, a first semiconductor layer 120 on the first electrode 110, a second semiconductor layer 130 on the first semiconductor layer 120, a third semiconductor layer 140 on the second semiconductor layer 130, a light emitting structure 150 on the third semiconductor layer 140, and a second electrode 160 on the light emitting structure 150. In addition, the light emitting structure 150 may include a first conductive semiconductor layer 151, an active layer 153 on the first conductive semiconductor layer 151, and a second conductive semiconductor layer 155 on the active layer 153.

According to the first embodiment, the first electrode 110 may include metallic layers having the characteristics of an ohmic contact layer, an adhesive layer, and a bonding layer, and may have transmittance or non-transmittance, but the embodiment is not limited thereto. For example, the pattern of the electrode may include one selected from the group consisting of Ti, Ru, Rh, Ir, Mg, Zn, Al, In, Ta, Pd, Co, Ni, Si, Ge, Ag, Au, and the alloy having at least two of the above elements, and may be formed in a single layer structure or a multi-layer structure.

According to the first embodiment, the first electrode 110 may include a plurality of patterns, and the sectional shape of the patterns may have at least one of a triangular shape, a rectangular shape, and a trapezoid shape, but the embodiment is not limited thereto. The first electrode 110 may include a plurality of patterns to increase the contact area of the first semiconductor layer 120 so that current may be efficiently injected.

The first semiconductor layer 120 may be disposed on the first electrode 110.

According to the first embodiment, the first electrode 110 may be disposed on a portion of the first semiconductor layer 120. Accordingly, as an area of the first semiconductor layer 120 exposed out of the first electrode 110 may be increased so that the light extraction efficiency may be improved.

According to the first embodiment, the first semiconductor layer 120 may include first conductive dopants in order to inject carriers into the light emitting structure 150. For example, the first semiconductor layer 120 may include an N type dopant, such as Si, Ge, Sn, Se, or Te.

In addition, according to the first embodiment, the first semiconductor layer 120 may include at least one of $Al_xGa_{(1-x)}N$ (0≤x≤1) and GaN. For example, the first semiconductor layer 120 may include a superlattice layer 121 formed by repeatedly stack $Al_xGa_{(1-x)}N$ (0≤x≤1) and GaN.

When the first semiconductor layer 120 may be formed of GaN, the contact resistance formed between the first semiconductor layer 120 and the first electrode 110 may be lowered, so that the operating voltage VF3 of the light emitting device 100 can be lowered. In addition, when the first semiconductor layer 120 is formed of GaN, excellent crystal quality can be obtained.

In addition, when the first semiconductor layer 120 is formed of $Al_xGa_{(1-x)}N$ (0≤x≤1), low light absorption efficiency is represented at a low wavelength band, so that the light extraction efficiency can be improved. According to the first embodiment, a last layer 123 (e.g., a layer is contacted with the second semiconductor layer 130) may be disposed on the superlattice layer 121 of the first semiconductor layer 120. In addition, the last layer 123 may be formed of GaN. Since the main purpose of the first semiconductor layer 120 is to inject carriers, the last layer 123 contacted with the second semiconductor layer 130 is formed of GaN to increase an amount of injected carriers. In addition, when the last layer 123 is formed of GaN, the crystal quality of the contact surface with the second semiconductor layer 130 can be improved. The last layer 123 may have the thickness of 20 nm to 100 nm. For example, the last layer 123 may have the thickness of 40 nm. When the thickness of the last layer 123 is less than 20 nm, the carrier injection into the light emitting structure 150 is difficult, so that the operating voltage may be increased. When the thickness of the last layer 123 exceeds 100 nm, light absorption by the last layer 123 is increased so that light loss may be rapidly increased.

Meanwhile, according to the first embodiment, the composition ratio (x) of aluminum (Al) in the $Al_xGa_{(1-x)}N$ (0≤x≤1) constituting the superlattice layer 121 may be in the range of 2% to 15%. When the composition ratio (x) of aluminum (Al) in the $Al_xGa_{(1-x)}N$ (0≤x≤1) is less than 2%, rapid light loss may occur. When the composition ratio (x) of aluminum (Al) exceeds 15%, the operating voltage VF may be rapidly increased.

According to the first embodiment, the thickness of the $Al_xGa_{(1-x)}N$ layer (0≤x≤1) constituting the superlattice layer 121 may be thinner than that of the GaN layer. According to the light emitting device 100 of the first embodiment, when the thickness of the GaN layer is thicker than the thickness of the $Al_xGa_{(1-x)}N$ layer (0≤x≤1), the operating voltage VF may be decreased.

According to the first embodiment, each of the $Al_xGa_{(1-x)}N$ layer (0≤x≤1) and the GaN layer constituting the superlattice layer 121 may have the thickness in the range of 1 nm to 15 nm. When the thicknesses of the $Al_xGa_{(1-x)}N$ layer (0≤x≤1) and the GaN layer exceeds 15 nm, the effect of blocking dislocation and adjusting cracks can be degraded. The thickness of less than 1 nm may not be formed due to a process characteristic. The superlattice layer 121 may include at least two pairs of $Al_xGa_{(1-x)}N$ (0≤x≤1) and GaN layers. For example, the first semiconductor layer 120 may have a superlattice structure formed by repeatedly stack 20 pairs of $Al_xGa_{(1-x)}N$ (0≤x≤1) and GaN layers having the thicknesses of 15 nm, respectively. Alternatively, the first semiconductor layer 120 may have a superlattice structure formed by repeatedly stack 20 pairs of $Al_xGa_{(1-x)}N$ (0≤x≤1) and GaN layers having the thicknesses of 2 nm, respectively, and the number of the pairs of $Al_xGa_{(1-x)}N$ (0≤x≤1) and GaN layers is not limited thereto.

Further, according to the first embodiment, the thickness of the first semiconductor layer 120 may be in the range of 300 nm to 1500 nm. In detail, the thickness of the first semiconductor layer 120 may be 1000 nm. When the first semiconductor layer 120 has the thickness of less than 300 nm, a pattern is formed to an inner part of the first semiconductor layer 120 through the second and third semiconductor layers 130 and 140 when an etching process is performed to form the patterns, so that the operating voltage may be increased. In addition, when the thickness of the first semiconductor layer 120 exceeds 1500 nm, the thickness of the GaN layer of the superlattice layer 121 is increased to increase the light absorption rate of the first semiconductor layer 120 so that the light loss may be caused. The width W and the depth D of the patterns of the first semiconductor layer 120 may be equal to those of the patterns of the first electrode 110, respectively. The patterns of the first semiconductor layer 120 may increase the contact area of the first electrode 110 so that current can be efficiently injected. In addition, the patterns of the first semiconductor layer 120 serve as a light extraction structure, so that light extraction efficiency can be improved.

Both ends of the patterns of the first semiconductor layer 120 may be overlapped with both ends of the patterns of the first electrode 110.

In other words, according to the first embodiment, the first electrode 110 may simultaneously contact with the $Al_xGa_{(1-x)}N$ (0≤x≤1) and GaN layers.

The second semiconductor layer 130 and the third semiconductor layer 140 may be disposed on the first semiconductor layer 120. When the second semiconductor layer 130 and the third semiconductor layer 140 are disposed on the first semiconductor layer 120 to directly contact with the first conductive semiconductor layer 151, excessive stress, such as tensile stress, may be applied to the first conductive semiconductor layer 151 due to the difference in composition between the first semiconductor layer 120 and the first conductive semiconductor layer 151. In addition, defects, such as misfit dislocation and cracks, may occur due to the stress. The defects cause leakage current, so that the ESD yield rate, the VR yield rate, or the IR yield rate of the light emitting device 100 may be lowered.

In order to prevent the above defects, the second semiconductor layer 130 and the third semiconductor layer 140 are interposed between the first semiconductor layer 120 and the first conductive semiconductor layer 151 to control stress.

First, according to the first embodiment, the second semiconductor layer 130 may include $Al_yGa_{(1-y)}N$ (0<y≤1). In addition, the second semiconductor layer 130 may include first conductive dopants. In this case, the doping concentration of the second semiconductor layer 130 may be lower than that of the first semiconductor layer 120. In addition, the second semiconductor layer 130 may include $Al_yGa_{(1-y)}N$ (0<y≤1). Further, the second semiconductor layer 130 may further include second conductive dopants, but the embodiment is not limited thereto.

Since the first conductive dopant, such as Si, has a lattice constant lower than that of gallium (Ga), the stress may be caused. In particular, when the last layer 123 of the first semiconductor layer 120 includes first conductive GaN, and when an $Al_yGa_{(1-y)}N$ (0<y≤1) including the first conductive dopant is disposed on the last layer 123, the lattices of Al and the first conductive dopant are smaller than that of Ga, so that excessive stress may be caused.

In other words, according to the first embodiment, the second semiconductor layer 130 is doped with the first conductive dopants at a doping concentration lower than that of the first semiconductor layer 120, thereby minimizing the stress caused by the first conductive dopants. Accordingly, the surface quality of the second semiconductor layer 130 can be improved. In addition, as the doping concentration of the second semiconductor layer 130 is lowered, the second semiconductor layer 130 makes it difficult for carriers to move in a vertical direction, so that current, which is supplied to a portion of the first semiconductor layer 120 by the first electrode 110, can be spread in a horizontal direction.

According the first embodiment, the thickness of the second semiconductor layer 130 may be in the range of 5 nm to 100 nm. In more detail, the thickness of the second semiconductor layer 130 may be in the range of 30 nm to 70 nm. When the second semiconductor layer 130 has the thickness of less than 5 nm, the surface quality may be slightly represented due to the thin thickness of the second semiconductor layer 130. When the thickness of the second semiconductor layer 130 exceeds 100 nm, carriers may not pass through the second semiconductor layer 130, so that the carriers may not be injected into the light emitting structure 150. Accordingly, the operating voltage may be increased.

The third semiconductor layer 140 may be disposed on the second semiconductor layer 130.

According to the first embodiment, the third semiconductor layer 140 may include $Al_zGa_{(1-z)}N$ (0<z≤1).

The first conductive semiconductor layer 151 may be heavily doped in order to inject carriers into the active layer 153. The third semiconductor layer 140 may be interposed between the second semiconductor layer 130 and the first conductive semiconductor layer 151 in order to reduce the stress caused between the first conductive semiconductor layer 151 and the second semiconductor layer 130.

According to the first embodiment, the third semiconductor layer 140 may be doped with the first conductive dopants at doping concentration varied depending on the positions of the third semiconductor layer 140. Hereinafter, for the convenience of explanation, an area of the third semiconductor layer 140 at the side of the second semiconductor layer 130 is defined as a lower portion, and an area of the third semiconductor layer 140 at the side of the first conductive semiconductor layer 151 is defined as an upper portion.

According to the first embodiment, in the third semiconductor layer 140, the doping concentration of the first conductive dopants may be increased toward the upper portion from the lower portion.

According to the first embodiment, the Al composition ratio of the third semiconductor layer 140 may be a value between the Al composition ratio of the second semiconductor layer 130 and the Al composition ratio of the first conductive semiconductor layer 151. In addition, according to the first embodiment, the Al composition ratio of the third semiconductor layer 140 may be gradually increased from the lower portion toward the upper portion. Accordingly, the third semiconductor layer 140 may reduce the stress caused depending on the Al composition ratio between the second semiconductor layer 130 and the first conductive semiconductor layer 151.

In addition, according to the first embodiment, the third semiconductor layer 140 may have the thickness in the range of 20 nm to 200 nm. In more detail, the third semiconductor layer 140 may have the thickness of 50 nm to 120 nm. In more detail, according to the first embodiment, the third semiconductor layer 140 may have the thickness of 80 nm. When the third semiconductor layer 140 has the thickness of less than 20 nm, an effect of reducing the stress by the third semiconductor layer 140 may be rapidly reduced. On the contrary, when the third semiconductor layer 140 has the thickness exceeding 200 nm, the resistance is increased due to the third semiconductor layer 140, so that the carrier injection into the light emitting structure 150 may be difficult. Accordingly, the operating voltage may be rapidly increased.

FIG. 2 is a graph showing doping concentrations of the second semiconductor layer 130, the third semiconductor layer 140, and the first conductive semiconductor layer 151 according to the first embodiment.

Referring to FIG. 2, the doping concentration of the bottom surface of the third semiconductor layer 140 may be equal to that of the second semiconductor layer 130. In addition, the doping concentration of the third semiconductor layer 140 is formed to be increased from the lower portion (LP) toward the upper portion (UP), so that the doping concentration of the top surface of the third semiconductor layer 140 may be equal to that of the first conductive semiconductor layer 151.

In other words, according to the first embodiment, the doping concentration of the third semiconductor layer 140 may be gradually increased from the doping concentration of the second semiconductor layer 130 toward the doping concentration of the first conductive semiconductor layer 151.

In detail, the third semiconductor layer 140 may include N type dopants (for example, Si), and the number of the N type dopants may be constantly increased from the lower portion (LP) of the third semiconductor layer 140 toward the upper portion (UP) of the third semiconductor layer 140.

FIG. 3 is a graph showing doping concentrations of the second semiconductor layer 130, the third semiconductor layer 140, and the first conductive semiconductor layer 151 according to the second embodiment.

Referring to FIG. 3, the doping concentration of the bottom surface of the third semiconductor layer 140 may be equal to the doping concentration of the second semiconductor layer 130. The doping concentration of the third semiconductor layer 140 may be increased from the lower portion toward the upper portion, so that the doping concentration of the top surface of the third semiconductor layer 140 may be equal to the doping concentration of the first conductive semiconductor layer 151. In other words, the doping concentration of the third semiconductor layer 140 may be increased from the doping concentration of the second semiconductor layer 130 toward the doping concentration of the first conductive semiconductor layer 151.

In detail, the third semiconductor layer 140 may include N type dopants (for example, Si), and the number of the N type dopants may be gradually increased from the lower portion (LP) of the third semiconductor layer 140 toward the upper portion (UP) of the third semiconductor layer 140.

In this case, according to the second embodiment, the increase rate of the doping concentration of the third semiconductor layer 140 may be decreased from the lower portion (LP) of the third semiconductor layer 140 toward the upper portion (UP) of the third semiconductor layer 140. In other words, the increase rate of the doping concentration of the third semiconductor layer 140 is increasingly represented at the lower portion (LP) of the third semiconductor layer 140, and gradually decreased toward the upper portion (UP) of the third semiconductor layer 140. According to the second embodiment, current can be more spread in the horizontal direction by more increasing the difference in the doping concentration from the second semiconductor layer 130.

Figure 4:
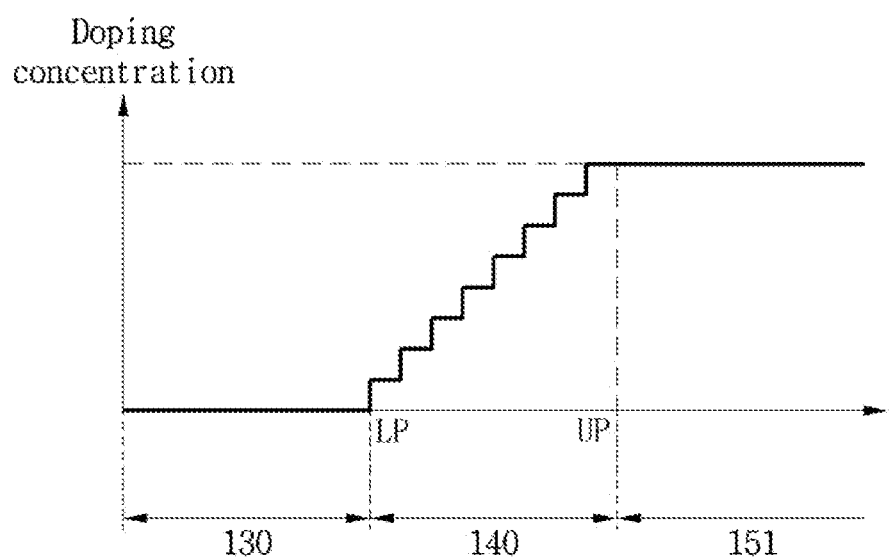
FIG. 4 is a graph showing doping concentrations of a second semiconductor layer, a third semiconductor layer, and a first conductive semiconductor layer according to the third embodiment.

FIG. 4 is a graph showing doping concentrations of the second semiconductor layer 130, the third semiconductor layer 140, and the first conductive semiconductor layer 151 according to the third embodiment.

Referring to FIG. 4, the doping concentration of the bottom surface of the third semiconductor layer 140 may be equal to the doping concentration of the second semiconductor layer 130. The doping concentration of the third semiconductor layer 140 may be gradually increased from the lower portion (LP) toward the upper portion (UP). The doping concentration of the top surface of the third semiconductor layer 140 may be equal to the doping concentration of the first conductive semiconductor layer 151. In other words, the doping concentration of the third semiconductor layer 140 may be increased from the doping concentration of the second semiconductor layer 130 toward the doping concentration of the first conductive semiconductor layer 151.

In detail, the third semiconductor layer 140 may include N type dopants (for example, Si), and the number of the N type dopants may be gradually increased from the lower portion (LP) of the third semiconductor layer 140 toward the upper portion (UP) of the third semiconductor layer 140.

In this case, according to the third embodiment, the doping concentration of the third semiconductor layer 140 may be increased stepwise as shown in FIG. 4. In other words, the third semiconductor layer 140 is divided into a plurality of layers, each of the layers has a constant doping concentration, and an upper layer may have a doping concentration higher than that of a lower layer.

According to the third embodiment, the lattice constant difference may be made on an interfacial surface between the layers of the third semiconductor layer 140 due to the doping concentration difference made on the interfacial surface, and the surface energy may be increased on the interfacial surface.

$$h_c = \frac{\Gamma \cdot M_f}{(1+v_f) \cdot Z\sigma_0^2} \quad \text{[Equation 1]}$$

(wherein, hc denotes a crack resistance, Γ(=2γ) denotes a fracture resistance, and γ denotes the surface energy of the crack plan.

Equation 1 represents a griffith crack propagation equation.

In Equation 1, the crack resistance may be increased as the surface energy is increased due to the doping concentration difference made on the interfacial surface of the layers of the third semiconductor layer 140. In addition, as the crack resistance is increased, cracks propagated toward the upper portion of the third semiconductor layer 140 may be reduced, so that the crystal quality may be improved.

Meanwhile, the light emitting structure may be disposed on the third semiconductor layer. The light emitting structure may include the first conductive semiconductor layer, the active layer, and the second conductive semiconductor layer. In addition, the second electrode may be disposed on the light emitting structure.

TABLE 1

| Structure | IR yield rate | VR yield rate |
|---|---|---|
| Ref | 62% | 54% |
| The total thicknesses of Ref +third semiconductor layer: 40 nm | 81% | 77% |
| The total thicknesses of Ref +third semiconductor layer: 80 nm | 87% | 83% |

Table 1 shows the comparisons between the VR yield rate and the IR yield rate according to the existence of the third semiconductor layer 140.

Figure 5:
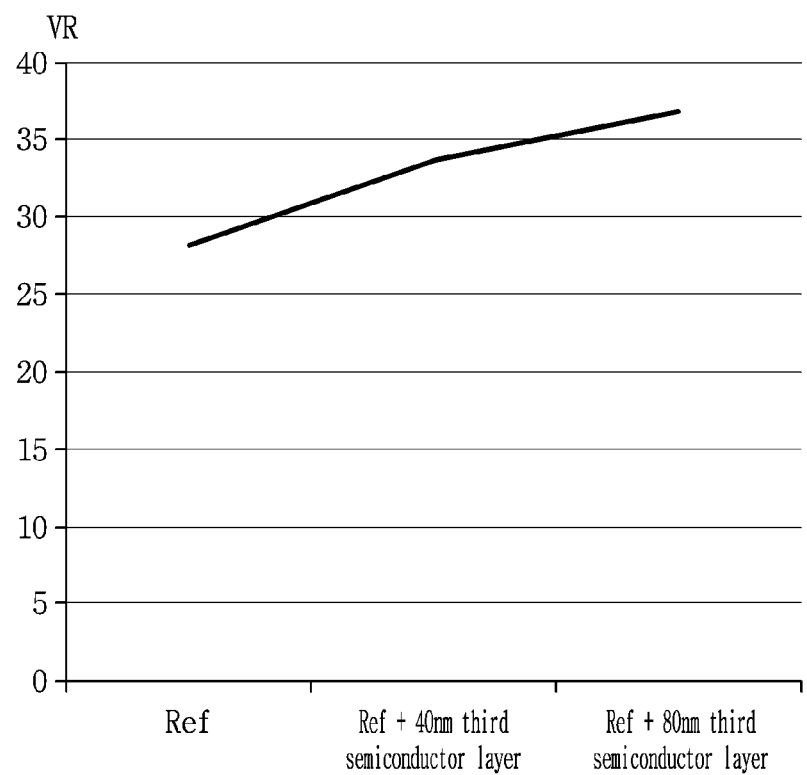
FIG. 5 is a graph showing the comparison between VR yield rates according to the existence of a third semiconductor layer.

FIG. 5 is a graph showing the comparison between the VR yield rates according to the existence of the third semiconductor layer 140.

The VR and IR yield rates are criterions to observe the behavior of current flow of the light emitting device 100 in a reverse area. In other words, the IR refers to the value of current flowing when a specific negative voltage is applied, and the VR refers to a voltage applied across both terminals when a specific negative current is applied. The improvement of the VR yield rate and the IR yield rate means the reduction of the current leakage path (for example, dislocation, misfi, crack, or the like). Accordingly, it can be recognized that the crystal quality of the semiconductor layer is improved.

As shown in FIG. 5 and table 1, it can be recognized that the VR and IR yield rates of the light emitting device 100 including the third semiconductor layer 140 having the thickness of 40 nm are more improved as compared with the reference having no the third semiconductor layer 140. Further, it can be recognized that the light emitting device 100 including the third semiconductor layer 140 having the thickness of 80 nm has the highest VR and IR yield rates.

Accordingly, the stress of the third semiconductor layer 140 is reduced, so that the crystal quality (especially, the surface crystal quality between the second semiconductor layer 130 and the third semiconductor layer 140) can be improved.

FIGS. 6 to 11 are sectional views showing a method of fabricating the light emitting device 100 according to the first embodiment.

Hereinafter, the method of fabricating the light emitting device 100 according to the first embodiment will be described with reference to FIGS. 6 to 11.

Figure 6:
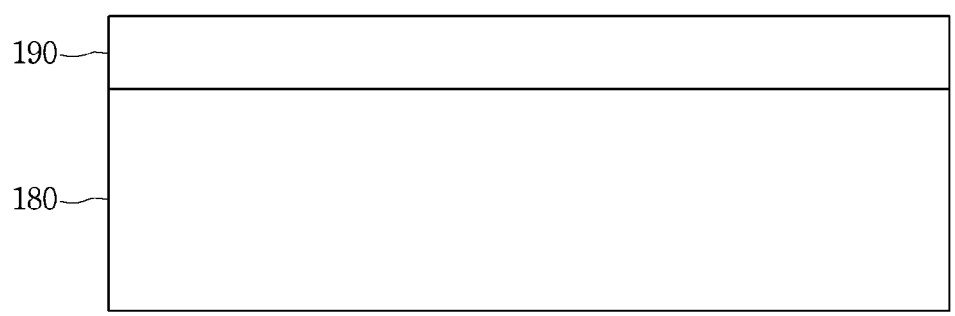
FIGS. 6 to 11 are sectional views showing a method of fabricating a light emitting device according to the first embodiment.

First, as shown in FIG. 6, a substrate 180 is prepared. The substrate 180 may be formed of a material representing excellent thermal conductivity, and may be a conductive substrate or an insulating substrate. For example, the substrate 180 may include at least one of sapphire ($Al_2O_3$), SiC, Si, GaAs, GaN, ZnO, GaP, InP, Ge, and $Ga_2O_3$. The substrate 180 may be provided thereon with a patterned sapphire substrate (PSS) (not shown), so that the light extraction efficiency can be improved, but the embodiment is not limited thereto.

Wet cleaning may be performed with respect to the substrate 180 to remove impurities from the surface of the substrate 180.

Before the light emitting structure 150 is formed, a buffer layer 190 may be formed on the substrate 180. The buffer layer 190 may reduce the lattice mismatch between the material of the first semiconductor layer 120 and the substrate 180. The buffer layer 190 may include at least one of group III-V compound semiconductors, for example, GaN, InN, AlN, InGaN, AlGaN, InAlGaN, and AlInN. In addition, an undoped semiconductor layer may be formed on the upper portion of the buffer layer 190, but the embodiment is not limited thereto.

Figure 7:
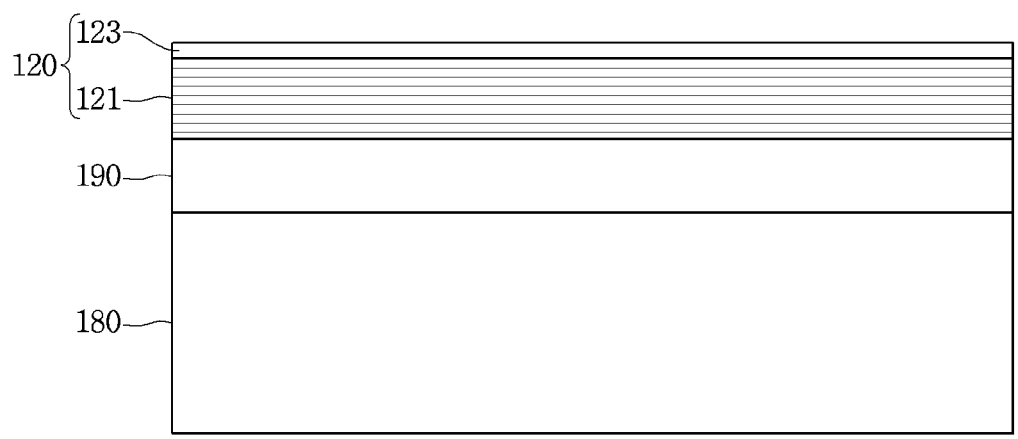

Thereafter, as shown in FIG. 7, the first semiconductor layer 120 may be formed on the buffer layer 190.

In addition, according to the first embodiment, the first semiconductor layer 120 may include at least one of $Al_xGa_{(1-x)}N$ ($0 \leq x \leq 1$) and GaN including first conductive dopants. For example, the first semiconductor layer 120 may include a superlattice layer 121 formed by repeatedly stack $Al_xGa_{(1-x)}N$ ($0 \leq x \leq 1$) and GaN. According to the first embodiment, the last layer 123 of the first semiconductor layer 120 may formed of GaN. Since the main purpose of the first semiconductor layer 120 is to inject carriers, the last layer 123 making contact with the second semiconductor layer 130 is formed of GaN to increase an amount of injected carriers. In addition, when the last layer 123 is formed of GaN, the crystal quality of the contact surface with the second semiconductor layer 130 can be improved.

According to the first embodiment, the last layer 123 may have the thickness of 20 nm to 100 nm. For example, the last layer 123 may have the thickness of 40 nm. When the thickness of the last layer 123 is less than 20 nm, the carrier injection into the light emitting structure 150 is difficult, so that the operating voltage may be increased. When the thickness of the last layer 123 exceeds 100 nm, light absorption by the last layer 123 is increased so that light loss may be rapidly increased.

Meanwhile, according to the first embodiment, the composition ratio (x) of aluminum (Al) in the $Al_xGa_{(1-x)}N$ ($0 \leq x \leq 1$) constituting the superlattice layer may be in the range of 2% to 15%. When the composition ratio of Al in the $Al_xGa_{(1-x)}N$ ($0 \leq x \leq 1$) is less than 2%, rapid light loss may occur. When the composition ratio of Al exceeds 15%, the operating voltage VF may be rapidly increased.

According to the first embodiment, the thickness of the $Al_xGa_{(1-x)}N$ ($0 \leq x \leq 1$) layer may be equal to or thinner than that of the GaN layer. In the light emitting device 100 according to the first embodiment, when the thickness of the GaN layer is thicker than that of the $Al_xGa_{(1-x)}N$ layer ($0 \leq x \leq 1$), the operating voltage (VF) may be decreased.

According to the first embodiment, the $Al_xGa_{(1-x)}N$ ($0 \leq x \leq 1$) layer and the GaN layer of the superlattice layer may have thicknesses in the range of 1 nm to 15 nm. When the thicknesses of the $Al_xGa_{(1-x)}N$ layer (0≤x≤1) and the GaN layer exceed 15 nm, the effect of blocking dislocation and adjusting cracks can be degraded. The thickness of less than 1 nm may not be formed due to a process characteristic.

According to the first embodiment, the thickness of the first semiconductor layer 120 may be in the range of 300 nm to 1500 nm. For example, the thickness of the first semiconductor layer 120 may be 1000 nm. When the first semiconductor layer 120 has the thickness of less than 300 nm, a pattern is formed to an inner part of the first conductive semiconductor layer 151 through the second and third semiconductor layers 130 and 140 when an etching process is performed to form the patterns, so that the operating voltage may be increased. In addition, when the thickness of the first semiconductor layer 120 exceeds 1500 nm, the thickness of the GaN layer of the superlattice layer 121 is increased to increase the light absorption rate of the first semiconductor layer 120 so that the light loss may be caused.

Figure 8:
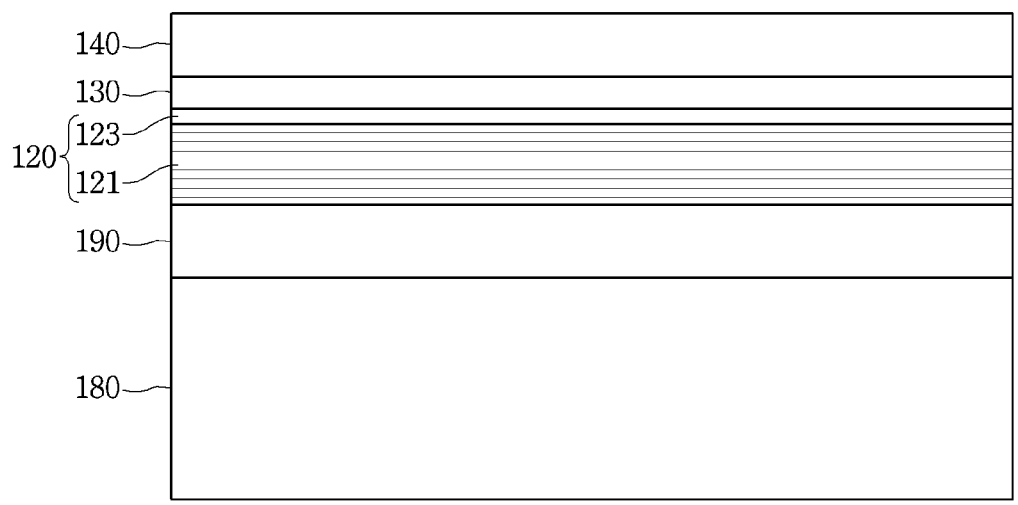

Referring to FIG. 8, the second semiconductor layer 130 and the third semiconductor layer 140 may be sequentially laminated on the first semiconductor layer 120.

First, the second semiconductor layer 130 may be formed of $Al_yGa_{(1-y)}N$ (0<y≤1). In addition, according to the first embodiment, the second semiconductor layer 130 may include a first conductive dopant. In this case, the doping concentration of the second semiconductor layer 130 may be lower than the doping concentration of the first semiconductor layer 120.

According to the first embodiment, the second semiconductor layer 130 may be formed undoped $Al_yGa_{(1-y)}N$ (0<y≤1). The second semiconductor layer 130 may additional include a second conductive dopant, but the embodiment is not limited thereto.

In other words, according to the first embodiment, the second semiconductor layer 130 is doped with the first conductive dopants at a doping concentration lower than that of the first semiconductor layer 120, thereby minimizing the stress caused by the first conductive dopants. Accordingly, the surface quality of the second semiconductor layer 130 can be improved. In addition, as the doping concentration of the second semiconductor layer 130 is lowered, the second semiconductor layer 130 makes it difficult for carriers to move in a vertical direction, so that current, which is supplied to a portion of the first semiconductor layer 120 by the first electrode 110, can be diffused in a horizontal direction.

According the first embodiment, the thickness of the second semiconductor layer 130 may be in the range of 5 nm to 100 nm. In more detail, according to the first embodiment, the thickness of the second semiconductor layer 130 may be in the range of 30 nm to 70 nm. When the second semiconductor layer 130 has the thickness of less than 5 nm, the surface quality may be slightly represented due to the thin thickness of the second semiconductor layer 130. When the thickness of the second semiconductor layer 130 exceeds 100 nm, carriers may not pass through the second semiconductor layer 130, so that the operating voltage may be increased.

The third semiconductor layer 140 may be disposed on the second semiconductor layer 130.

According to the first embodiment, the third semiconductor layer 140 may be formed of $Al_zGa_{(1-z)}N$ (0<z≤1).

According to the first embodiment, the third semiconductor layer 140 may be doped with the first conductive dopants at doping concentration varied depending on the positions of the third semiconductor layer 140.

According to the first embodiment, in the third semiconductor layer 140, the doping concentration of the first conductive dopants may be increased toward the upper portion from the lower portion.

In addition, according to the first embodiment, the doping concentration of the bottom surface of the third semiconductor layer 140 may be equal to that of the second semiconductor layer 130. In addition, the doping concentration of the third semiconductor layer 140 is formed to be increased from the lower portion toward the upper portion, so that the doping concentration of the top surface of the third semiconductor layer 140 may be equal to that of the first conductive semiconductor layer 151.

According to the first embodiment, the rate of change in the doping concentration of the third semiconductor layer 140 may have various values. For example, according to the first embodiment, the doping concentration of the third semiconductor layer 140 may be formed to be increased at the constant rate of change from the doping concentration of the second semiconductor layer 130 to the doping concentration of the first conductive semiconductor layer 151. According to the second embodiment, the rate of change in the doping concentration of the third semiconductor layer 140 may be decreased from the lower portion to the upper portion of the third semiconductor layer 140. In other words, according to the second embodiment, the doping concentration of the third semiconductor layer 140 may have the large rate of change at the lower portion of the third semiconductor layer 140, and the small rate of change at the upper portion of the third semiconductor layer 140. According to the third embodiment, the doping concentration of the third semiconductor layer 140 may be formed to be increased stepwise. In other words, the third semiconductor layer 140 is divided into a plurality of layers, each of the layers has predetermined doping concentration, and the third semiconductor layer 140 may have higher doping concentration at the upper layer thereof than the lower layer thereof.

In addition, according to the first embodiment, the third semiconductor layer 140 may have the thickness in the range of 20 nm to 200 nm. In more detail, the third semiconductor layer 140 may have the thickness of 50 nm to 120 nm. In more detail, according to the first embodiment, the third semiconductor layer 140 may have the thickness of 80 nm. When the third semiconductor layer 140 has the thickness of less than 20 nm, an effect of reducing the stress by the third semiconductor layer 140 may be rapidly reduced. On the contrary, when the third semiconductor layer 140 has the thickness exceeding 200 nm, the resistance is increased due to the third semiconductor layer 140, so that the carrier injection into the light emitting structure 150 may be difficult. Accordingly, the operating voltage may be rapidly increased.

Figure 9:
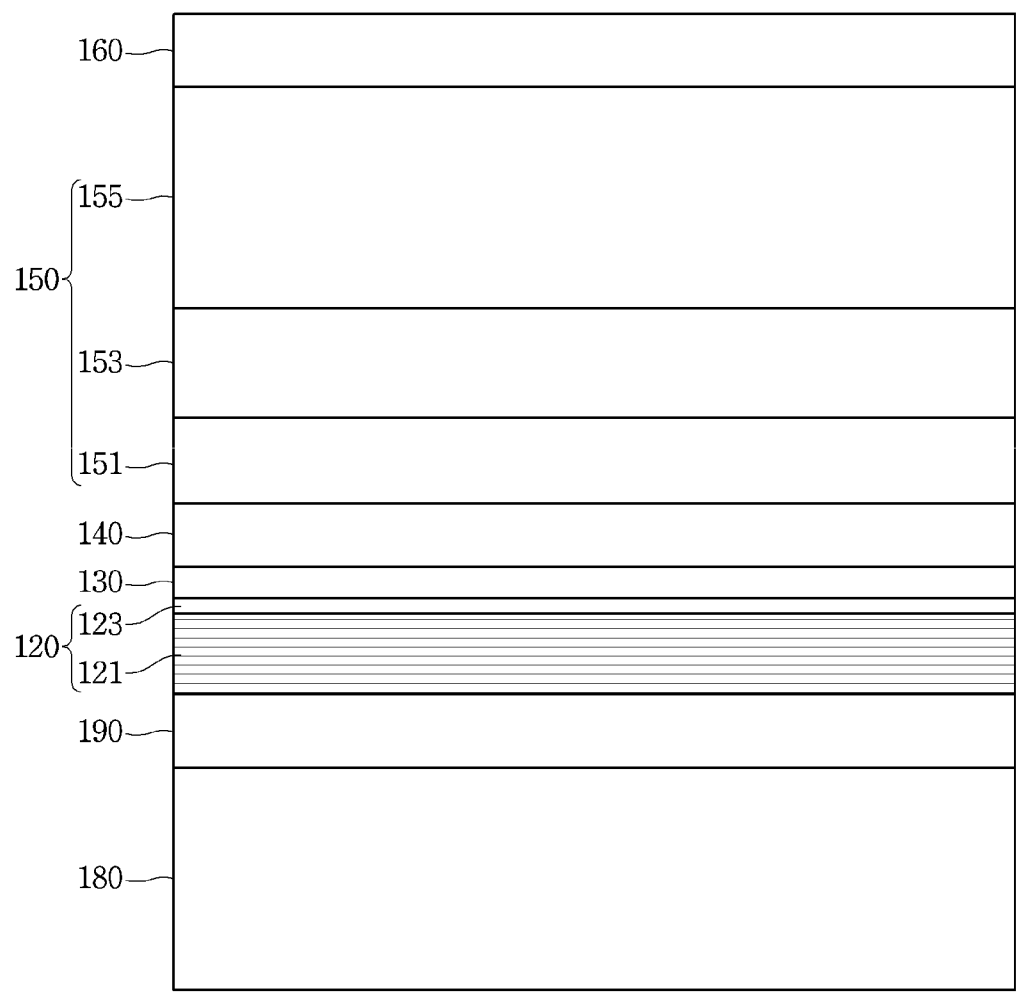

Thereafter, referring to FIG. 9, the light emitting structure 150 and the second electrode 160 may be sequentially formed on the third semiconductor layer 140.

The light emitting structure 150 may be formed by sequentially stack the first conductive semiconductor layer 151 on the third semiconductor layer 140, the active layer 153 on the first conductive semiconductor layer 151, and the second conductive semiconductor layer 155 on the active layer 153.

The first conductive semiconductor layer 151 may be realized using group III-V compound semiconductors and group II-VI compound semiconductors. The first conductive dopants may be doped into the first conductive semiconductor layer 151. When the first conductive semiconductor layer 151 is an N type semiconductor layer, the first conductive dopant may include an N type dopant, such as Si, Ge, Sn, Se, or Te, but the embodiment is not limited thereto.

The first conductive semiconductor layer 151 may include a semiconductor material having a composition formula of $In_aAl_bGa_{1-a-b}N$ (0≤a≤1, 0≤b≤1, 0≤a+b≤1). The first conductive semiconductor layer 151 may include at least one of GaN, InN, AlN, InGaN, AlGaN, InAlGaN, AlInN, AlGaAs, InGaAs, AlInGaAs, GaP, AlGaP, InGaP, AlInGaP, and InP. According to the first embodiment, the first conductive semiconductor layer 151 may include AlGaN in order to minimize light loss when the active layer 153 emits light having ultraviolet wavelength band, but the embodiment is not limited thereto.

The first conductive semiconductor layer 151 may be formed as the GaN layer through chemical vapor deposition (CVD), molecular beam epitaxy (MBE), sputtering, or hydride vapor phase epitaxy (HVPE). In this case, the GaN layer may be formed as trimethyl gallium gas (TMGa), ammonia gas ($NH_3$), nitrogen gas ($N_2$), and silane gas (SiH4) including N type impurities, such as silicon (Si) are introduced into the chamber in which the process is performed.

Next, the active layer 153 may be formed on the first conductive semiconductor layer 151.

The active layer 153 emit light having energy determined by the intrinsic energy band of a material constituting the active layer 153 (light emission layer) as electrons injected through the first conductive semiconductor layer 151 meet holes injected through a second conductive semiconductor layer 155 formed after the first conductive semiconductor layer 151.

The active layer 153 may be formed in at least one of a single-quantum well (SQW) structure, a multi-quantum well (MQW) structure, a quantum-wire structure and a quantum dot structure. For example, the active layer 153 may have the MQW structure as trimethyl gallium gas (TMGa), ammonia gas (NH3), nitrogen gas (N2), and trimethyl indium gas (TMIn) are introduced, but the embodiment is not limited thereto.

The active layer 153 may be formed in a paired structure including at least one of quantum well/quantum barrier, InGaN/GaN, InGaN/InGaN, GaN/AlGaN, InAlGaN/GaN, GaAs/AlGaAs, GaP/AlGaP, InGaAs/AlGaAs, and InGaP/AlGaP, but the embodiment is not limited thereto. The quantum well may be formed of a material having a bandgap lower than that of the quantum barrier.

Next, the second conductive semiconductor layer 155 may be formed on the active layer 153.

The second conductive semiconductor layer 155 may be formed of a semiconductor compound, and may be realized by using group III-V or group II-VI compound semiconductors. In addition, the second conductive semiconductor layer 155 may be doped with the second conductive dopants.

For example, the second conductive semiconductor layer 155 may include a semiconductor material having a composition formula of $In_cAl_dGa_{1-c-d}N$ (0≤c≤1, 0≤d≤1, 0≤c+d≤1). When the second conductive semiconductor layer 155 is a P type semiconductor, the second conductive dopant may include Mg, Zn, Ca, Sr, or Ba serving as the P type dopant.

According to the first embodiment, the first conductive semiconductor layer 151 and the second conductive semiconductor layer 155 may be realized by using a P type semiconductor layer and an N type semiconductor, but the embodiment is not limited thereto. In addition, a semiconductor, for example, an N type semiconductor layer (not shown) having a polarity opposite to a second conductive polarity may be formed on the second conductive semiconductor layer 155. Accordingly, the light emitting structure 150 may be realized in one of an N-P junction structure, a P-N junction structure, an N-P-N junction structure, a P-N-P junction structure.

Next, the second electrode 160 may be formed on the second conductive semiconductor layer 155.

The second electrode 160 may be formed to include an ohmic contact pattern and a reflective layer.

According to the first embodiment, the second electrode 160 may include at least one conductive material, and may be formed in a single layer structure or a multi-layer structure. For example, the second electrode 160 may include at least one of metal, a metallic oxide, and a metallic nitride.

Figure 10:
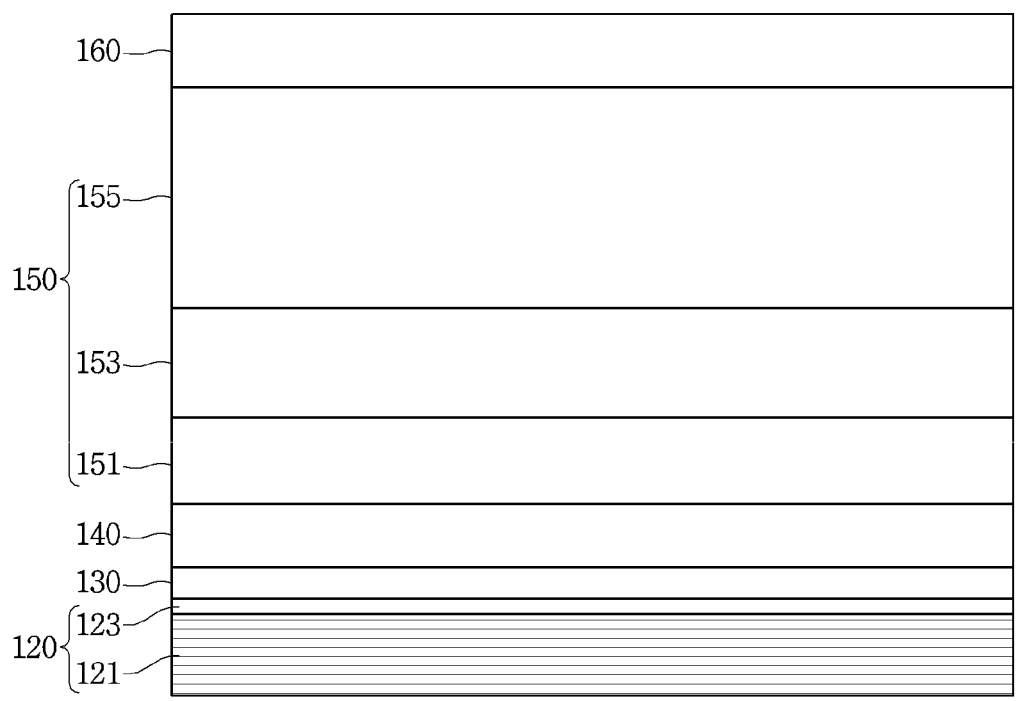
Figure 11:
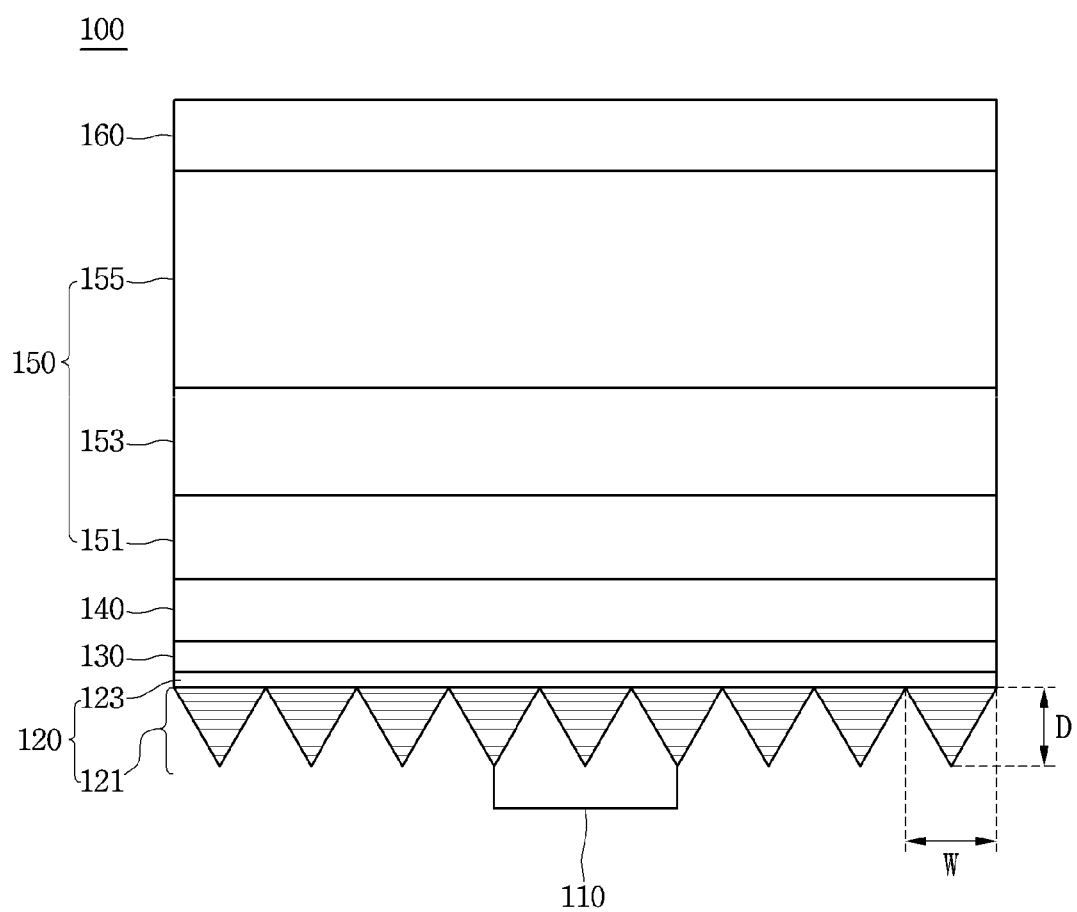

Referring to FIGS. 10 to 11, after removing the growth substrate 180 and the first conductive semiconductor layer 151, the first semiconductor layer 120 may be etched in the form of multiple patterns.

For example, the patterns may be formed in a triangular shape through the etching process. The height and the width of the patterns may be associated with the thickness of the first semiconductor layer 120.

Next, referring to FIG. 11, the first electrode 110 may be etched in multiple patterns corresponding to the patterns of the first semiconductor layer 120. The first electrode 110 subject to the etching process may make contact with the first semiconductor layer 120 subject to the etching process so that the first electrode 110 may be overlapped with the first semiconductor layer 120. In other words, the first electrode 110 is overlapped with the first semiconductor layer 120 including at least one of $Al_xGa_{(1-x)}N$ (0≤x≤1) or GaN, so that the first electrode 110 may make contact with at least one of $Al_xGa_{(1-x)}N$ (0≤x≤1) or GaN.

Figure 12:
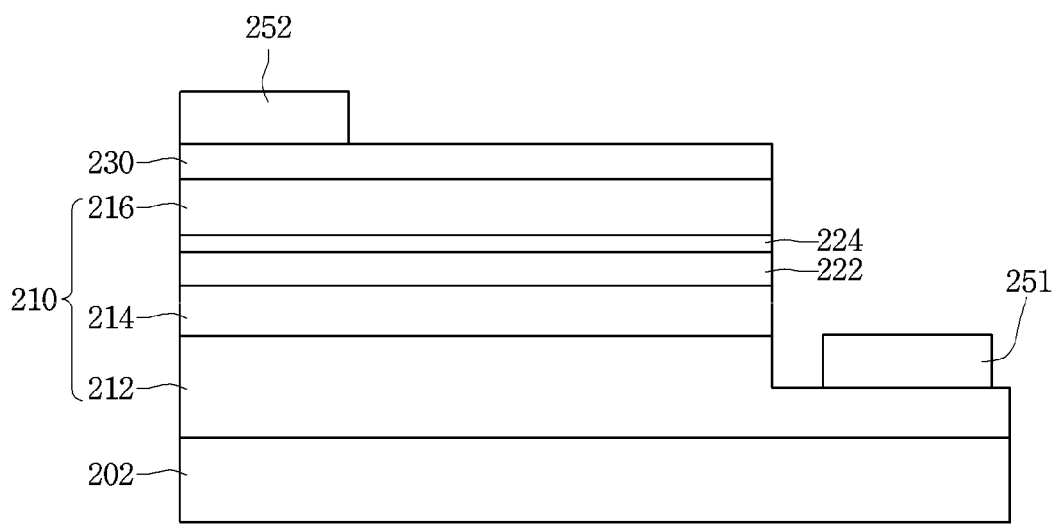
FIG. 12 is a sectional view showing a light emitting device according to the fourth embodiment.

FIG. 12 is a sectional view showing a light emitting device 200 according to the fourth embodiment.

The light emitting device 200 according to the fourth embodiment may include a first conductive semiconductor layer 212, an active layer 214 on the first conductive semiconductor layer 212, and a second conductive semiconductor layer 216 on the active layer 214. The first conductive semiconductor layer 212, the active layer 214, and the second conductive semiconductor layer 216 may be defined as the light emitting structure 210.

According to the embodiment, an $Al_pGa_qIn_{1-p-q}N$ layer (0<p≤1, 0≤q≤1) 222 may be interposed between the active layer 214 and the second conductive semiconductor layer 216 to perform a function of blocking an electron, so that the light emission efficiency can be increased.

According to the embodiment, a transmissive electrode 230 may be disposed on the second conductive semiconductor layer 216, a second electrode 252 is electrically connected with the second conductive semiconductor layer 216, and a first electrode 251 is electrically connected with the first conductive semiconductor layer 212.

As shown in FIG. 12, the embodiment may be a lateral-type light emitting device 200 in which the light emitting structure 210 is disposed on a substrate 202, but the embodiment is not limited thereto. In other words, the embodiment is applicable to a vertical-type light emitting device.

Figure 13:
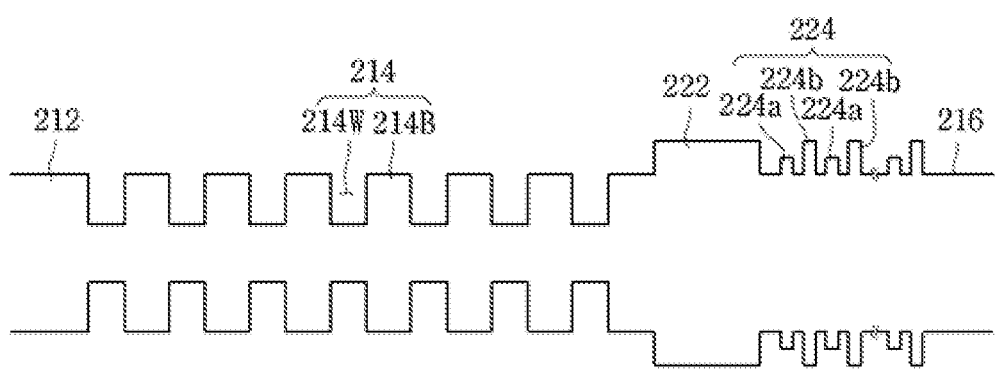
FIG. 13 is a diagram showing an energy bandgap of a light emitting device according to the fourth embodiment.

FIG. 13 is a diagram showing energy bandgap of the light emitting device according to the fourth embodiment.

The embodiment can provide a light emitting device capable of improving a luminous intensity or an electrical characteristic.

Conventionally, when an AlGaN layer is used as an electron blocking layer, and a P type AlGaN layer is used as a hole injection layer, Mg and a lamination defect, such as a pyramidal inversion domain (PID), are smoothly not diffused to the surface of a P type semiconductor layer, which has been completely grown. a hole may be collected on the interfacial surface between the AlGaN electron blocking layer and the P type AlGaN layer.

When the lamination defects are collected on the interfacial surface, hole injection is difficult due to the unsaturated defects which are dangling bonds, so that contact resistance is increased. Accordingly, the operating voltage VF3 may be increased, and the luminous intensity (Po) may be degraded.

In order to solve the problem, the light emitting device according to the fourth embodiment may include an AlGaN-based superlattice layer 224 interposed between the $Al_pGa_qIn_{1-p-q}N$ layer ($0<p\leq1$, $0\leq q\leq1$) 222 and the second conductive semiconductor layer 216.

For example, as shown in FIG. 13, according to the fourth embodiment, the AlGaN-based superlattice layer 222 may include an undoped $Al_rGa_{1-r}N$ layer ($0<r<1$) 224a and a P type $Al_sGa_{1-s}N$ layer ($0<s<1$) 224b.

According to the fourth embodiment, the superlattice layer of the undoped $Al_rGa_{1-r}N$ layer ($0<r<1$) 224a and the P-type $Al_sGa_{1-s}N$ layer ($0<s<1$) 224b is interposed between the $Al_pGa_qIn_{1-p-q}N$ layer ($0<p\leq1$, $0\leq q\leq1$) 222 and the second conductive semiconductor layer 216 to uniformly spread the lamination defects of the Mg or the PID concentrated on the interfacial surface, so that the hole injection efficiency can be increased, and the current spreading can be improved due to a 2-dimensional hole gas (2DHG) effect.

In detail, the superlattice layer of the undoped $Al_rGa_{1-r}N$ layer ($0<r<1$) 224a and the P-type $Al_sGa_{1-s}N$ layer ($0<s<1$) 224b prevent Mg serving as a P type doping element or the lamination defect of the PID from being concentrated or uniformly spread the concentrated lamination defects. Accordingly, the interface quality between the $Al_pGa_qIn_{1-p-q}N$ layer ($0<p\leq1$, $0\leq q\leq1$) 222 and the second conductive semiconductor layer 216 can be improved, so that the hole injection efficiency can be improved. Accordingly, the luminous intensity (Po) can be improved and the operating voltage (VF3) can be improved.

In addition, according to the fourth embodiment, the AlGaN-based superlattice layer 224 includes the undoped $Al_rGa_{1-r}N$ layer ($0<r<1$) 224a to form the superlattice structure. Accordingly, the current spreading can be effectively achieved due to the diffusion of carriers, so that the internal light emission efficiency can be increased.

According to the fourth embodiment, one pair or five pairs of the undoped $Al_rGa_{1-r}N$ layer ($0<r<1$) 224a and the P-type $Al_sGa_{1-s}N$ layer ($0<s<1$) 224b may be provided. At least one of the undoped $Al_rGa_{1-r}N$ layer ($0<r<1$) 224a and the P-type $Al_sGa_{1-s}N$ layer ($0<s<1$) 224b may be provided to improve the luminous intensity and diffuse carriers. If the number of pairs exceeds five, a thick superlattice structure or a thick undoped $Al_rGa_{1-r}N$ layer ($0<r<1$) 224a is formed, which may be disadvantageous to hole injection.

According to the fourth embodiment, the thickness of the undoped $Al_rGa_{1-r}N$ layer ($0<r<1$) 224a or the P-type $Al_sGa_{1-s}N$ layer ($0<s<1$) 224b may be in the range of about 1.5 nm to about 3 nm. If the thickness of each layer of the undoped $Al_rGa_{1-r}N$ layer ($0<r<1$) 224a or the P-type $Al_sGa_{1-s}N$ layer ($0<s<1$) 224b exceeds 3 nm, the light emitting device may be disadvantageous to hole injection. If the thickness of each layer of the undoped $Al_rGa_{1-r}N$ layer ($0<r<1$) 224a or the P-type $Al_sGa_{1-s}N$ layer ($0<s<1$) 224b is less than 1.5 nm, the surface quality may be less improved.

According to the fourth embodiment, the undoped $Al_rGa_{1-r}N$ layer ($0<r<1$) 224a may have an Al concentration r equal to or less than an Al concentration s of the P-type $Al_sGa_{1-s}N$ layer ($0<s<1$) 224b. If the Al concentration r of the undoped $Al_rGa_{1-r}N$ layer ($0<r<1$) 224a is greater than the Al concentration s of the P-type $Al_sGa_{1-s}N$ layer ($0<s<1$) 224b, current spreading may be lowered.

For example, the Al concentration p of the undoped $Al_rGa_{1-r}N$ layer ($0<r<1$) 224a may be in the range of $0.04 \leq r \leq 0.15$.

If the Al concentration r of the undoped $Al_rGa_{1-r}N$ layer ($0<r<1$) 224a is less than 0.04, the diffusion block effect of Mg or the PID or the distribution effect of Mg or the PID is reduced, so that the light generated from a quantum well is absorbed, so that the luminous intensity may be degraded. Meanwhile, if the Al concentration r of the undoped $Al_rGa_{1-r}N$ layer ($0<r<1$) 224a exceeds 0.15, quality or hole injection is degraded due to the high Al composition, so that the luminous intensity may be degraded, and the operating voltage (VF3) may be increased.

The Al concentration s of the P-type $Al_sGa_{1-s}N$ layer ($0<s<1$) 224b may be $0.20 \leq s \leq 0.35$.

If the Al concentration s of the P-type $Al_sGa_{1-s}N$ layer ($0<s<1$) 224b is less than 0.20, the diffusion blocking effect of Mg or the PID may be lowered. Meanwhile, when the Al concentration s of the P-type $Al_sGa_{1-s}N$ layer exceeds 0.34, hole injection or crystal quality may be degraded due to the higher Al composition, so that the luminous intensity may be degraded, and the operating voltage (VF3) may be increased.

The embodiment can provide a light emitting device capable of improving an electrical characteristic by improving luminous intensity and the operating voltage (VF3) as hole injection efficiency is increased by improving the interface quality of the light emitting device.

In addition, according to the fourth embodiment, the interface quality is improved and the carrier diffusion function is increased, so that the internal light emission efficiency can be increased.

Hereinafter, a method of fabricating the light emitting device according to the fourth embodiment will be described with reference to FIGS. 14 to 16.

Figure 14:
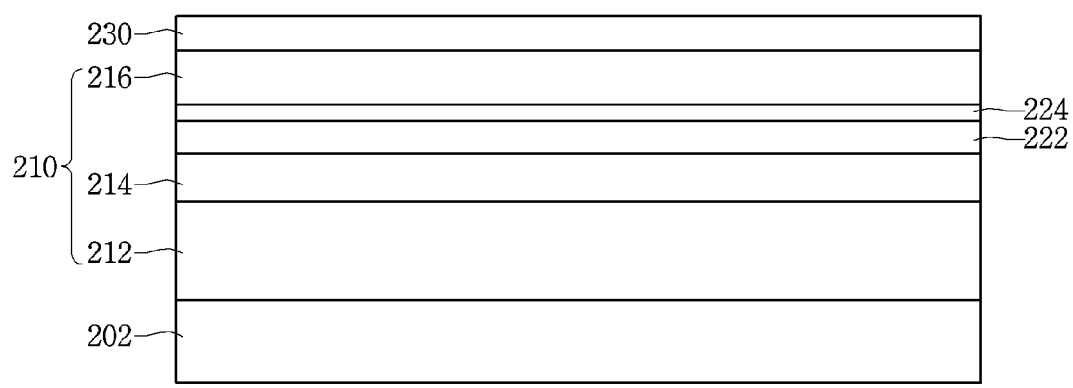
FIGS. 14 to 16 are sectional views showing a method of fabricating a light emitting device according to the fourth embodiment.

First, a substrate 202 is prepared as shown in FIG. 14. The substrate 202 may be formed of a material representing superior thermal conductivity, and may include a conductive substrate or an insulating substrate.

For example, the substrate 202 may include at least one of sapphire ($Al_2O_3$), SiC, Si, GaAs, GaN, ZnO, GaP, InP, Ge, and $Ga_2O_3$. A concavo-convex structure may be formed on the substrate 202, but the embodiment is not limited thereto.

In this case, the buffer layer (not shown) may be formed on the substrate 202. The buffer layer may reduce the lattice mismatch between the material of the light emitting structure 210 formed in the subsequent process and the substrate 202. The buffer layer may include at least one of group III-V compound semiconductors, for example, GaN, InN, AlN, InGaN, AlGaN, InAlGaN, and AlInN.

Next, the light emitting structure 210 including the first conductive semiconductor layer 212, the active layer 214 and the second conductive semiconductor layer 216 may be formed on the first substrate 202.

The first conductive semiconductor layer 212 may be formed of a semiconductor compound. The first conductive semiconductor layer 212 may be realized by using the group III-V compound semiconductors and the group II-VI compound semiconductors. The first conductive semiconductor layer 212 may be doped with the first conductive dopants. When the first conductive semiconductor layer 212 is an N type semiconductor layer, the first conductive dopants may include Si, Ge, Sn, Se, or Te serving as an N type dopant.

The first conductive semiconductor layer 212 may include a semiconductor material having the composition formula of $In_aAl_bGa_{1-a-b}N$ ($0 \leq a \leq 1$, $0 \leq b \leq 1$, $0 \leq a+b \leq 1$).

The first conductive semiconductor layer 212 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 214 may be formed in at least one of a single-quantum well (SQW) structure, a multi-quantum well (MQW) structure, a quantum-wire structure and a quantum dot structure. For example, the active layer 153 may have the MQW structure as trimethyl gallium gas (TMGa), ammonia gas ($NH_3$), nitrogen gas ($N_2$), and trimethyl indium gas (TMIn) are introduced, but the embodiment is not limited thereto.

The active layer 214 may have the structure of quantum well 214W/quantum barrier 214B. For example, the active layer 214 may be formed in a paired structure including at least one of AlGaN/AlGaN, InGaN/GaN, InGaN/InGaN, GaN/AlGaN, InGaN/AlGaN, InAlGaN/GaN, GaAs/AlGaAs, InGaAs/AlGaAs, GaP/AlGaP, and InGaP/AlGaP, but the embodiment is not limited thereto.

Next, the $Al_pGa_qIn_{1-p-q}N$ layer ($0<p \leq 1$, $0 \leq q \leq 1$) 222 is formed on the active layer 214 so that the $Al_pGa_qIn_{1-p-q}N$ layer 222 has energy bandgap higher than that of the active layer 214. Accordingly, the $Al_pGa_qIn_{1-p-q}N$ layer ($0<p \leq 1$, $0 \leq q \leq 1$) 222 performs the electron blocking and the MQW cladding of the active layer 214, so that the light emission efficiency can be improved.

Next, an AlGaN-based superlattice layer 224 may be formed on the $Al_pGa_qIn_{1-p-q}N$ layer ($0<p \leq 1$, $0 \leq q \leq 1$) 222.

In detail, as shown in FIG. 13, according to the fourth embodiment, the AlGaN-based superlattice layer 224 may include the undoped $Al_rGa_{1-r}N$ layer ($0<r<1$) 224a and the P-type $Al_sGa_{1-s}N$ layer ($0<s<1$) 224b.

According to the fourth embodiment, the superlattice layer of the undoped $Al_rGa_{1-r}N$ layer ($0<r<1$) 224a and the P-type $Al_sGa_{1-s}N$ layer ($0<s<1$) 224b is interposed between the $Al_pGa_qIn_{1-p-q}N$ layer ($0<p \leq 1$, $0 \leq q \leq 1$) 222 and the second conductive semiconductor layer 216 to uniformly spread the lamination defects of the Mg or the PID concentrated on the interfacial surface, so that the hole injection efficiency can be increased, and the current spreading can be improved due to a 2-dimensional hole gas (2DHG) effect.

According to the fourth embodiment, one pair or five pairs of the undoped $Al_rGa_{1-r}N$ layer ($0<r<1$) 224a and the P-type $Al_wGa_{1-w}N$ layer ($0<w<1$) 224b may be provided. At least one of the undoped $Al_rGa_{1-r}N$ layer ($0<r<1$) 224a and the P-type $Al_sGa_{1-s}N$ layer ($0<s<1$) 224b may be provided to improve the luminous intensity and diffuse carriers. If the number of pairs exceeds five, a thick superlattice structure or a thick undoped $Al_rGa_{1-r}N$ layer ($0<r<1$) 224a is formed, which may be disadvantageous to hole injection.

According to the fourth embodiment, the thickness of the undoped $Al_rGa_{1-r}N$ layer ($0<r<1$) 224a or the P-type $Al_sGa_{1-s}N$ layer ($0<s<1$) 224b may be in the range of about 1.5 nm to about 3 nm. If the thickness of each layer of the undoped $Al_rGa_{1-r}N$ layer ($0<r<1$) 224a or the P-type $Al_sGa_{1-s}N$ layer ($0<s<1$) 224b exceeds 3 nm, the thickness may be disadvantageous to hole injection. If the thickness of each layer of the undoped $Al_rGa_{1-r}N$ layer ($0<r<1$) 224a or the P-type $Al_sGa_{1-s}N$ layer ($0<s<1$) 224b is less than 1.5 nm, the surface quality may be less improved.

According to the fourth embodiment, the undoped $Al_rGa_{1-r}N$ layer ($0<r<1$) 224a may have an Al concentration r equal to or less than an Al concentration s of the P-type $Al_sGa_{1-s}N$ layer ($0<s<1$) 224b. If the Al concentration r of the undoped $Al_rGa_{1-r}N$ layer ($0<r<1$) 224a is greater than the Al concentration s of the P-type $Al_sGa_{1-s}N$ layer ($0<s<1$) 224b, current spreading may be lowered.

For example, the Al concentration r of the undoped $Al_rGa_{1-r}N$ layer ($0<r<1$) 224a may be in the range of $0.04 \leq r \leq 0.15$. If the Al concentration r of the undoped $Al_rGa_{1-r}N$ layer ($0<r<1$) 224a is less than 0.04, the diffusion block effect of Mg or the PID or the distribution effect of Mg or the PID is reduced, so that the light generated from a quantum well is absorbed, so that the luminous intensity may be degraded. Meanwhile, if the Al concentration r of the undoped $Al_rGa_{1-r}N$ layer ($0<r<1$) 224a exceeds 0.15, quality or hole injection is degraded due to the high Al composition, so that the luminous intensity may be degraded, and the operating voltage (VF3) may be increased.

The Al concentration z of the P-type $Al_sGa_{1-s}N$ layer ($0<s<1$) 224b may be $0.20 \leq s \leq 0.35$. If the Al concentration s of the P-type $Al_sGa_{1-s}N$ layer ($0<s<1$) 224b is less than 0.20, the diffusion blocking effect of Mg or the PID may be lowered. Meanwhile, when the Al concentration s of the P-type $Al_sGa_{1-s}N$ layer ($0<s<1$) exceeds 0.34, hole injection or crystal quality may be degraded due to the high Al composition, so that the luminous intensity may be degraded, and the operating voltage (VF3) may be increased.

Referring back FIG. 14, the second conductive semiconductor layer 216 may be formed on the AlGaN-based superlattice layer 224.

The second conductive semiconductor layer 216 may include a semiconductor material having the composition formula of $In_cAl_dGa_{1-d-d}N$ ($0 \leq c \leq 1$, $0 \leq d \leq 1$, $0 \leq c+d \leq 1$). If the second semiconductor layer 130 is a P type semiconductor layer, the second conductive dopant may include Mg, Zn, Ca, Sr, or Ba serving as the P type dopant.

According to the fourth embodiment, although the first conductive semiconductor layer 212 is realized using an N type semiconductor layer, and the second conductive semiconductor layer 216 is realized using the P type semiconductor layer, the embodiment is not limited thereto.

In addition, a semiconductor, for example, an N type semiconductor layer (not shown) having a polarity opposite to a second conductive polarity may be formed on the second conductive semiconductor layer 216. Accordingly, the light emitting structure 210 may be realized in one of an N-P junction structure, a P-N junction structure, an N-P-N junction structure, a P-N-P junction structure.

Thereafter, the transmissive electrode 230 is formed on the second conductive semiconductor layer 216.

For example, the transmissive electrode 230 may include an ohmic layer, and may be formed by stack single metal, a metallic alloy, or a metallic oxide in a single layer structure or a multi-layer structure so that hole injection can be efficiently performed.

For example, the transmissive electrode 230 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

Figure 15:
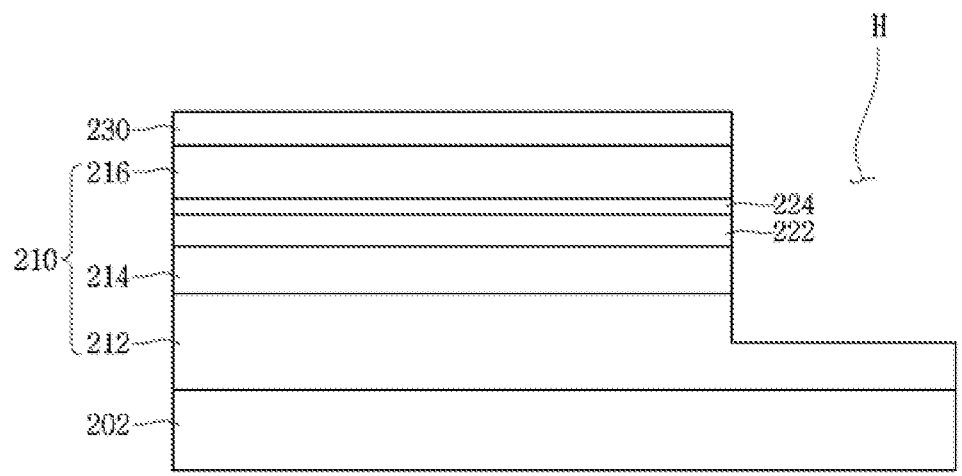

Thereafter, as shown in FIG. 15, portions of the transmissive electrode 230, the second conductive semiconductor layer 216, the AlGaN-based superlattice layer 224, the $Al_pGa_qIn_{1-p-q}N$ layer (0<p≤1, 0≤q≤1) 222, and the active layer 214 may be removed to expose the first conductive semiconductor layer 212.

Figure 16:
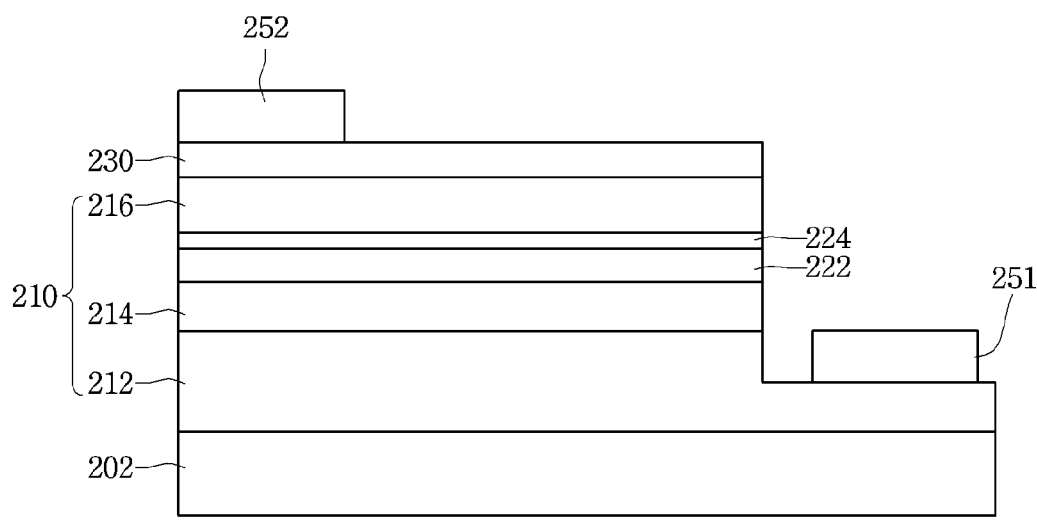

Next, as shown in FIG. 16, the second electrode 252 is formed on the transmissive electrode 230, and the first electrode 251 is formed on the first conductive semiconductor layer 212 to form the light emitting device 200 according to the fourth embodiment. A through hole (not shown) is formed in a portion of the transmissive electrode 230, so that the second electrode 252 formed on the transmissive electrode 230 makes contact with the second conductive semiconductor layer 216, but the embodiment is not limited thereto. In addition, a concavo-convex pattern (not shown) is formed on a top surface of the transmissive electrode 230, thereby improving the external light extraction efficiency of light emitted from the active layer 214, but the embodiment is not limited thereto.

The embodiment can provide a light emitting device capable of improving an electrical characteristic by improving luminous intensity and the operating voltage (VF3) as hole injection efficiency is increased by improving the interface quality of the light emitting device, and a method of fabricating the same.

In addition, according to the fourth embodiment, the interface quality is improved and the carrier diffusion function is increased, so that the internal light emission efficiency can be increased.

Figure 17:
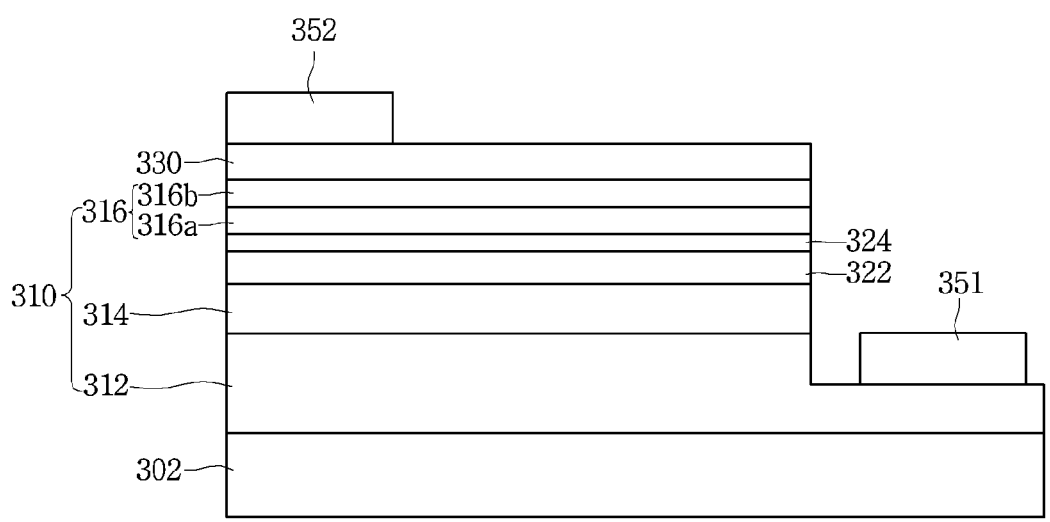
FIG. 17 is a sectional view showing a light emitting device according to the fifth embodiment.

FIG. 17 is a sectional view showing a light emitting device 300 according to a fifth embodiment.

The light emitting device 300 according to the fifth embodiment may include a first conductive semiconductor layer 312, an active layer 314 on the first conductive semiconductor layer 312, and a second conductive semiconductor layer 316 on the active layer 314. The first conductive semiconductor layer 312, the active layer 314, and the second conductive semiconductor layer 316 may be defined as a light emitting structure 310.

According to the embodiment, an $Al_pGa_qIn_{1-p-q}N$ layer (0<p≤1, 0≤q≤1) 322 is interposed between the active layer 314 and the second conductive semiconductor layer 316 to perform an electron blocking function so that the light emission efficiency can be increased.

According to the embodiment, a transmissive electrode 330 may be disposed on the second conductive semiconductor layer 316, a second electrode 352 electrically connected with the second conductive semiconductor layer 316, and a first electrode 351 electrically connected with the first conductive semiconductor layer 312.

As shown in FIG. 17, according to the embodiment, the light emitting device 300 may be a lateral-type light emitting device in which the light emitting structure 310 is disposed on a substrate 302, but the embodiment is not limited thereto. In other words, the embodiment is applicable to a vertical-type light emitting device or a flip-chip light emitting device.

Figure 18:
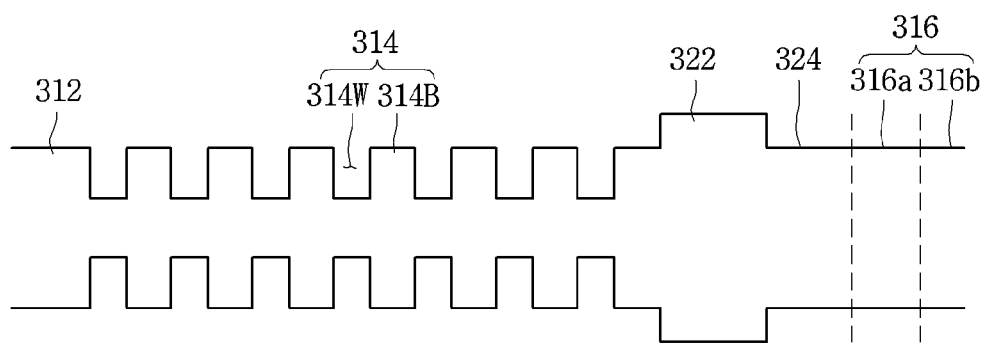
FIG. 18 is a diagram showing a first energy bandgap of a light emitting device according to the fifth embodiment.

FIG. 18 is a diagram showing first energy bandgap of the light emitting device according to the fifth embodiment.

The embodiment can provide a high-efficiency nitride semiconductor light emitting device capable of overcoming the degradation of the light emission efficiency when injected current is increased.

To this end, according to the embodiment, an undoped $Al_tGa_{1-t}N$ layer (0≤t<1) 324 may be interposed between the $Al_pGa_qIn_{1-p-q}N$ layer (0<p≤1, 0≤q≤1) 322 and the second conductive semiconductor layer 316.

The second conductive semiconductor layer 316 may include a first concentration-second conductive semiconductor layer 316a having a first concentration and a second concentration-second conductive semiconductor layer 316b having a second concentration higher than the first concentration and formed on the first concentration-second conductive semiconductor layer.

As shown in FIG. 18, the undoped $Al_tGa_{1-t}N$ layer (0≤t<1) may be an undoped GaN layer 324, and the second conductive semiconductor layer 316 may be a P type GaN layer.

For example, the second conductive semiconductor layer 316 may include a first concentration-P type GaN layer 316a having the first concentration on the undoped GaN layer 324, and a second concentration-P type GaN layer 316b having the second concentration on the first concentration-P type GaN layer 316a.

Figure 19:
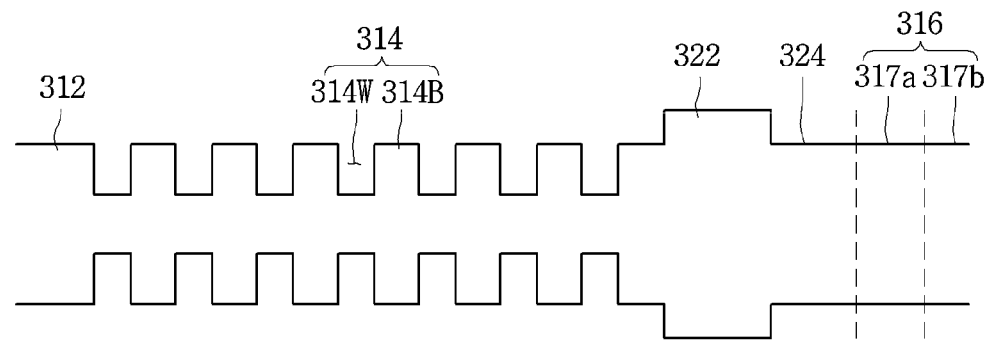
FIG. 19 is a diagram showing a second energy bandgap of the light emitting device according to the fifth embodiment.

FIG. 19 is a diagram showing a second energy bandgap of the light emitting device according to the fifth embodiment.

According to another embodiment, the undoped $Al_pGa_{1-p}N$ layer (0≤p<1) may include an undoped AlGaN-based layer 325, and the second conductive semiconductor layer 316 may be a P type AlGaN-based layer.

For example, as shown in FIG. 19, the second conductive semiconductor layer 316 may include a first concentration-P type AlGaN-based layer 317a having a first concentration on the undoped AlGaN-based layer 325, and a second concentration-P type AlGaN-based layer 317b having a second concentration higher than the first concentration on the first concentration-P type AlGaN-based layer 317a.

According to the embodiment, as shown in FIG. 18 or 19, the $Al_pGa_qIn_{1-p-q}N$ layer (0<p≤1, 0≤q≤1) 322 is interposed between the active layer 314 and the second conductive semiconductor layer 316 to perform a function of blocking an electron, so that the light emission efficiency can be increased.

In this case, the thickness of the $Al_pGa_qIn_{1-p-q}N$ layer (0<p≤1, 0≤q≤1) 322 may be in the range of about 10 nm to about 50 nm. In more detail, the thickness of the $Al_pGa_qIn_{1-p-q}N$ layer (0<p≤1, 0≤q≤1) 322 may be in the range of 15 nm to 30 nm, but the embodiment is not limited thereto.

When the thickness of $Al_pGa_qIn_{1-p-q}N$ layer (0<p≤1, 0≤q≤1) 322 is less than 10 nm, the electron blocking effect is lowered, so that the device characteristic may be degraded, and the yield rate may be degraded. When the thickness of the $Al_pGa_qIn_{1-p-q}N$ layer (0<p≤1, 0≤q≤1) 322 exceeds 50 nm, the hole injection is difficult, so that the operating voltage (VF3) may be increased, and the luminous intensity (Po) may be lowered.

Figure 20A:
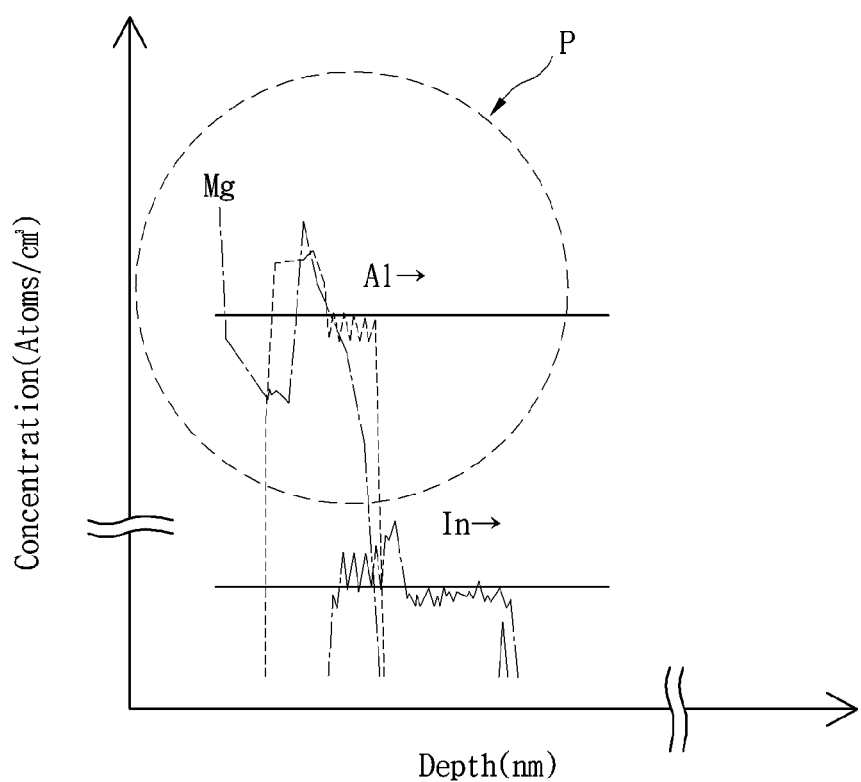
FIG. 20A is a graph showing composition data of the light emitting device according to the fifth embodiment.
Figure 20B:
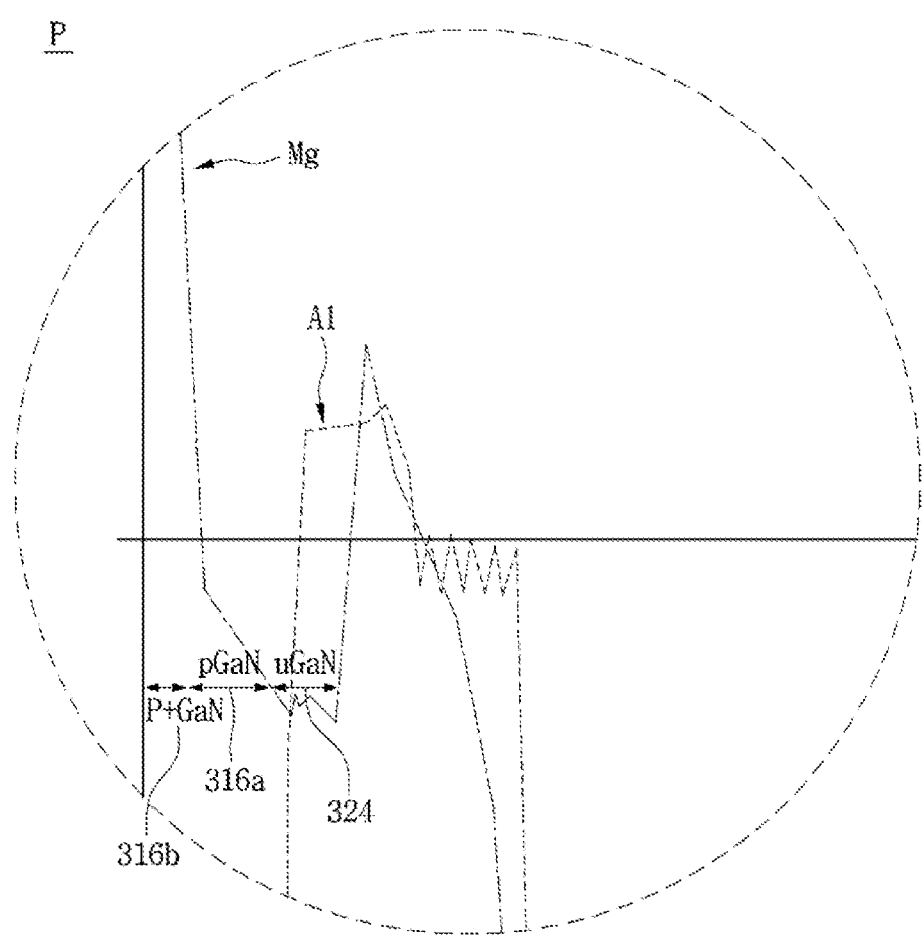
FIG. 20B is a partially enlarged view showing the composition data of the light emitting device according to the fifth embodiment.

FIG. 20A is a graph showing composition data of the light emitting device according to the fifth embodiment, and FIG. 20B is a partially enlarged view P showing the composition data of the light emitting device according to the fifth embodiment.

For example, as described with reference to FIG. 18, according to the fifth embodiment, the undoped $Al_tGa_{1-t}N$ layer (0≤t<1) 324 and the second conductive semiconductor layer 316 on the undoped $Al_tGa_{1-t}N$ layer (0≤t<1) 324 may be provided. Although FIG. 20B shows the case that the undoped $Al_tGa_{1-t}N$ layer (0≤t<1) 324 is the GaN layer 324, the embodiment is not limited thereto.

In addition, as shown in FIG. 18, according to the fifth embodiment, the second conductive semiconductor layer 316 may be a P type GaN layer, but the embodiment is not limited thereto. The doping concentration of the P type dopant may be $1 \times 10^{18}$ to $1 \times 10^{22}$ (atoms/$cm^3$).

For example, the doping concentration of the P type dopant in the first concentration-P type GaN layer 316a may be in the range of $1\times10^{18}$ to $8\times10^{19}$ (atoms/cm$^3$). When the doping concentration of the P type dopant in the first concentration-P type GaN layer 316a is less than $1\times10^{18}$, the hole concentration may be degraded. When the doping concentration exceeds $8\times10^{19}$ (atoms/cm$^3$), the mobility of holes is lowered due to the degradation of the morphology or the quality.

In addition, the doping concentration of the P type dopant in the second concentration-P type GaN layer 316b may be in the range of $1\times10^{20}$ to $1\times10^{22}$ (atoms/cm$^3$), but the embodiment is not limited thereto.

According to the light emitting device of the fifth embodiment, an undoped Al$_t$Ga$_{1-t}$N layer (0≤t<1) 324 is interposed between the Al$_p$Ga$_q$In$_{1-p-q}$N layer (0<p≤1, 0≤q≤1) 322 and the second conductive semiconductor layer 316, so that the current spreading resulting from the hole spreading can be smoothly performed in the undoped Al$_t$Ga$_{1-t}$N layer (0≤t<1) 324, so that the yield rate can be improved, and the thermal characteristic can be improved.

In addition, according to the fifth embodiment, the hole mobility is enhanced in the undoped Al$_t$Ga$_{1-t}$N layer (0≤t<1) 324, so that the luminous intensity (Po) is improved to about 10 mW or more in the high current injection area of 500 mA or more.

Accordingly, the embodiment can provide a high-efficiency nitride semiconductor light emitting device capable of overcoming the degradation of the light emission efficiency occurring when injected current is increased, a method of fabricating the same, a light emitting device package, and a lighting system.

Figure 21A:
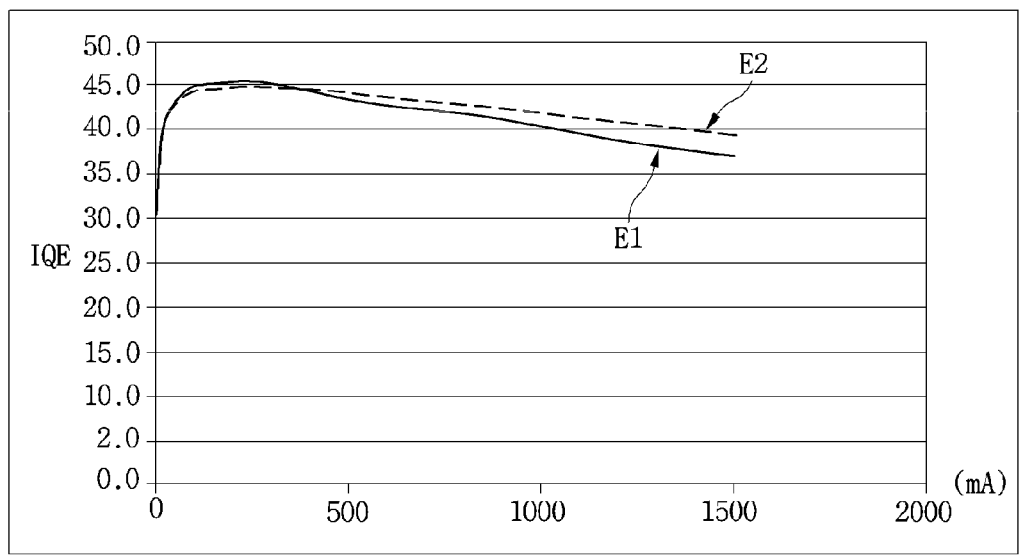
FIG. 21A is a graph showing a second internal light emission efficiency E2 and comparison data E1 as a function of the injected current of the light emitting device according to the fifth embodiment
Figure 21B:
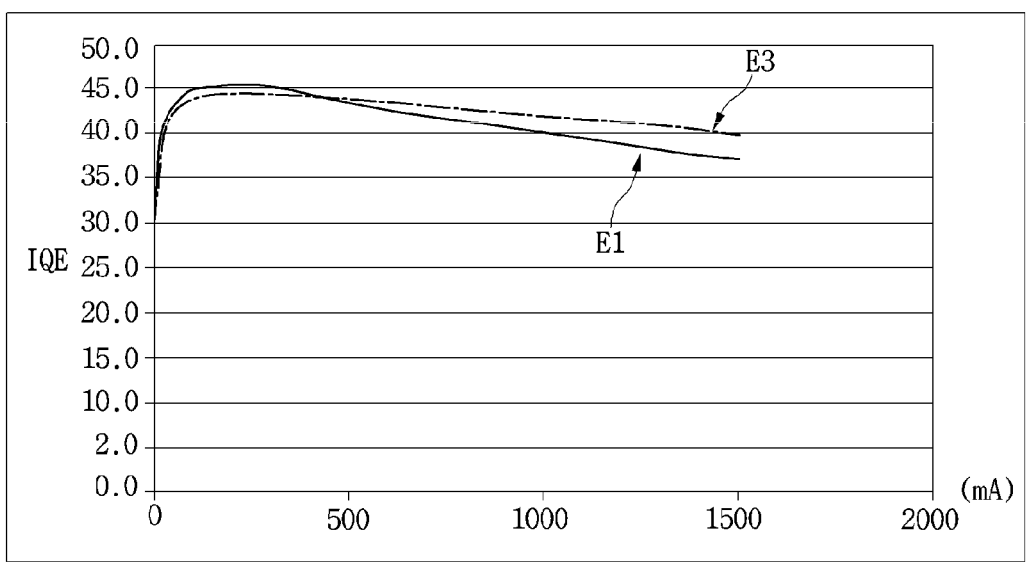
FIG. 21B is a graph showing a third internal light emission efficiency E3 and the comparison data E1 as a function of injected current of the light emitting device according to the fifth embodiment.

FIG. 21 A is a graph showing a second internal light emission efficiency E2 and comparison data E1 as a function of the injected current of the light emitting device according to the fifth embodiment, and FIG. 21B is a graph showing a third internal light emission efficiency E3 and the comparison data E1 as a function of injected current of the light emitting device according to the fifth embodiment.

When the whole thickness of the undoped Al$_t$Ga$_{1-t}$N layer (0≤t<1) 324, the first concentration-second semiconductor layer 316a, and the second concentration-second conductive semiconductor layer 316b after the Al$_p$Ga$_q$In$_{1-p-q}$N layer (0<p≤1, 0≤y≤1) 322 may be in the range of about 40 nm to about 150 nm, the hole injection efficiency can be increased and the crystal quality can be improved. In more detail, when the whole thickness in the range of about 50 nm to about 100 nm, a greater effect can be produced.

When the whole thickness of the undoped Al$_t$Ga$_{1-t}$N layer (0≤t<1) 324, the first concentration-second conductive semiconductor layer 316a and the second concentration-second conductive semiconductor layer 316b is less than 40 nm, the light emitting device is disadvantageous to hole concentration. When the whole thickness exceeds 150 nm, the crystal quality may be degraded, and light loss may occur due to the light absorption by p-GaN.

The thickness of the second concentration-second conductive semiconductor layer 316a may be in the range of about 10 nm to about 20 nm. When the thickness is less than 10 nm, the light emitting device is disadvantageous to hole concentration. When the thickness exceeds 20 nm, quality may be degraded and light loss may occur as light is absorbed by the second concentration-second conductive semiconductor layer 316b.

In addition, when the second concentration-second conductive semiconductor layer 316b having high concentration exceeds 20 nm to be formed with a thick thickness, as P type dopants are heavily doped in order to form the second concentration-second conductive semiconductor layer 316b, point defects or dislocation may cause light absorption.

The occupation ratio of the undoped Al$_t$Ga$_{1-t}$N layer (0≤t<1) 324 may be 50% or more in the sum of the thicknesses of the undoped Al$_t$Ga$_{1-t}$N layer (0≤t<1) 324 and the first concentration-second conductive semiconductor layer 316a.

For example, the thickness of the undoped Al$_t$Ga$_{1-t}$N layer (0≤t<1) 324 may be 1.0 or more times the thickness of the first concentration-second conductive semiconductor layer 316a.

When the thickness of the undoped Al$_t$Ga$_{1-t}$N layer (0≤t<1) 324 may be less than 1.0 times the thickness of the first concentration-second conductive semiconductor layer 316a, the light emitting device is disadvantageous to current spreading, so that the internal light emission efficiency is rapidly reduced as high current is injected. Accordingly, a droop characteristic may be degraded. The droop characteristic may be degraded at the high current of about 500 mA or more.

For example, when the thickness of the undoped Al$_t$Ga$_{1-t}$N layer (0≤t<1) 324 may be 1.0 to 1.5 times the thickness of the first concentration-second conductive semiconductor layer 316a, the droop characteristic can be remarkably improved.

When the thickness ratio of both layers is less than 1.0, the undoped Al$_t$Ga$_{1-t}$N layer (0≤t<1) 324 has an excessive thin thickness, so that the effect of the current spreading cannot be excellently produced. When the thickness ratio of both layers exceeds 1.5, hole injection is not smoothly performed, so that the droop characteristic may be degraded.

In detail, FIG. 21A is a graph showing droop curve data in the case that the thickness ratio between the undoped Al$_t$Ga$_{1-t}$N layer (0≤t<1) 324 and the first concentration-second conductive semiconductor layer 316a (former/latter) is 0.75 in the comparison example E1 and the thickness ratio is 1.0 in the second internal light emission efficiency E2.

As shown in FIG. 21A, the second internal light emission efficiency E2 according to the first embodiment is more lowered as compared with the comparison example E1 as high current of 500 nmA or more is applied. Accordingly, according to the fifth embodiment, as high current is applied, the internal light emission efficiency can be increased due to the increase of the current spreading and the hole injection efficiency by the undoped Al$_t$Ga$_{1-t}$N layer (0≤t<1) 324.

FIG. 21B is a graph showing a droop curve data in the case that the thickness ratio in the comparison example E1 is 0.75 as shown in FIG. 21A, and the thickness ratio in a third internal light emission efficiency E3 is 1.25.

As shown even in FIG. 21B, the third internal light emission efficiency E3 according to the second embodiment is more lowered as compared with the comparison example E1 as high current of 500 nmA or more is applied.

The embodiment can provide a high-efficiency nitride semiconductor light emitting device capable of overcoming the degradation of the light emission efficiency occurring when the injected current is increased.

For example, according to the light emitting device of the fifth embodiment, the current spreading can be smoothly performed, so that the yield rate can be improved, and the thermal characteristic can be improved.

In addition, according to the fifth embodiment, the hole mobility is enhanced in the undoped Al$_p$Ga$_{1-p}$N layer region, so that the luminous intensity (Po) can be improved.

Hereinafter, the method of fabricating the light emitting device according to the fifth embodiment will be described with reference to FIGS. 22 to 24 and the technical feature according to the embodiment can be more described.

Figure 22:
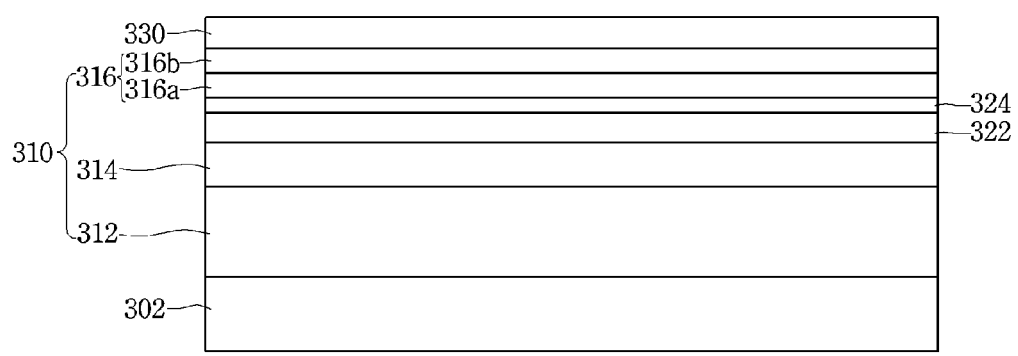
FIGS. 22 to 24 are sectional view showing a method of fabricating the light emitting device according to the fifth embodiment.

First, as shown in FIG. 22, the substrate 302 is prepared as a growth substrate. The substrate 302 may be formed of a material representing excellent thermal conductivity, and may be a conductive substrate or an insulating substrate.

For example, the substrate 302 may include at least one of sapphire ($Al_2O_3$), SiC, Si, GaAs, GaN, ZnO, GaP, InP, Ge, and $Ga_2O_3$. The substrate 302 may be provided thereon with a concavo-convex structure, so that the light extraction efficiency can be improved, but the embodiment is not limited thereto.

In this case, the buffer layer (not shown) may be formed on the substrate 302. The buffer layer may reduce the lattice mismatch between the material of the light emitting structure 310 formed in the subsequent process and the substrate 302. The buffer layer may include at least one of group III-V compound semiconductors, for example, GaN, InN, AlN, InGaN, AlGaN, InAlGaN, and AlInN.

Next, the light emitting structure 310 including the first conductive semiconductor layer 312, the active layer 314 and the second conductive semiconductor layer 316 may be formed on the first substrate 302.

The first conductive semiconductor layer 312 may be formed of a semiconductor compound. The first conductive semiconductor layer 312 may be realized by using the group III-V compound semiconductors and the group II-VI compound semiconductors. The first conductive semiconductor layer 312 may be doped with the first conductive dopants. When the first conductive semiconductor layer 312 is an N type semiconductor layer, the first conductive dopants may include Si, Ge, Sn, Se, or Te serving as an N type dopant.

The first conductive semiconductor layer 312 may include a semiconductor material having the composition formula of $In_aAl_bGa_{1-a-b}N$ ($0 \le a \le 1$, $0 \le b \le 1$, $0 \le a+b \le 1$).

The first conductive semiconductor layer 312 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 153 may be formed in at least one of a single-quantum well (SQW) structure, a multi-quantum well (MQW) structure, a quantum-wire structure and a quantum dot structure. For example, the active layer 153 may have the MQW structure as trimethyl gallium gas (TMGa), ammonia gas ($NH_3$), nitrogen gas ($N_2$), and trimethyl indium gas (TMIn) are introduced, but the embodiment is not limited thereto.

As shown in FIG. 18, the active layer 314 may have the structure of quantum well 314W/quantum barrier 314B. For example, the active layer 314 may be formed in a paired structure including at least one of AlInGaN/AlGaN, AlInGaN/GaN, InGaN/GaN, InGaN/InGaN, GaN/AlGaN, InGaN/AlGaN, InAlGaN/GaN, GaAs/AlGaAs, InGaAs/AlGaAs, GaP/AlGaP, and InGaP/AlGaP, but the embodiment is not limited thereto. The active layer 314 may emit light having an UV wavelength band, but the embodiment is not limited thereto.

Hereinafter, the technical feature according to the embodiment will be more described with reference to FIG. 18 or 19.

According to the embodiment, an $Ap_xGa_qIn_{1-p-q}N$ layer ($0<p \le 1$, $0 \le q \le 1$) 322 is formed on the active layer 314 to perform the electron blocking and the MQW cladding, so that the light emission efficiency can be improved.

The $Al_pGa_qIn_{1-p-q}N$ layer ($0<p \le 1$, $0 \le q \le 1$) 322 has the thickness in the range of about 10 nm to about 50 nm. In more detail, the $Al_pGa_qIn_{1-p-q}N$ layer ($0<p \le 1$, $0 \le q \le 1$) 322 may have the thickness in the range of 15 nm to 30 nm, but the embodiment is not limited thereto.

When the $Al_pGa_qIn_{1-p-q}N$ layer ($0<p \le 1$, $0 \le q \le 1$) 322 has the thickness of less than 10 nm, the electron blocking effect is degraded, so that the device characteristic may be lowered and the yield rate may be lowered. When the $Al_pGa_qIn_{1-p-q}N$ layer ($0<p \le 1$, $0 \le q \le 1$) 322 has the thickness exceeding 50 nm, the hole injection is difficult, so that the operating voltage (VF3) may be increased, and the luminous intensity (Po) may be lowered.

According to the embodiment, in order to provide the high-efficiency nitride semiconductor light emitting device capable of overcoming the degradation of the light emission efficiency occurring when the injected current is increased, the undoped $Al_tGa_{1-t}N$ layer ($0 \le t<1$) 324 may be formed on the $Al_pGa_qIn_{1-p-q}N$ layer ($0<p \le 1$, $0 \le q \le 1$) 322.

Thereafter, the second conductive semiconductor layer 316 may be formed on the undoped $Al_tGa_{1-t}N$ layer ($0 \le t<1$) 324.

The second conductive semiconductor layer 316 may include the first concentration-second conductive semiconductor layer 316a and the second concentration-second conductive semiconductor layer 316b having the second concentration higher than the first concentration on the first concentration-second conductive semiconductor layer 316a.

For example, as shown in FIG. 18, according to the embodiment, the undoped $Al_tGa_{1-t}N$ ($0 \le t<1$) layer and the second conductive semiconductor layer 316 may be disposed on the undoped $Al_tGa_{1-t}N$ layer ($0 \le t<1$) 324. Although FIG. 18 shows that the undoped $Al_tGa_{1-t}N$ layer ($0 \le t<1$) 324 is the GaN layer, the embodiment is not limited thereto.

In addition, as shown in FIG. 18, according to the fifth embodiment, the second conductive semiconductor layer 316 may be a P type GaN layer, but the embodiment is not limited thereto. The doping concentration of the P type dopant may be in the range of $1 \times 10^{18}$ to $1 \times 10^{22}$ (atoms/$cm^3$).

For example, the doping concentration of the P type dopants in the first concentration-P type GaN layer 316a may be in the range of $1 \times 10^{18}$ to $8 \times 10^{19}$ (atoms/$cm^3$). When the doping concentration of the p type dopant in the first concentration-P type GaN layer 316a is less than $1 \times 10^{18}$, the hole concentration may be lowered. When the doping concentration exceeds $8 \times 10^{19}$ (atoms/$cm^3$), the mobility of holes is lowered due to the degradation of the morphology or the quality.

In addition, the doping concentration of the P type dopant in the second concentration-P type GaN layer 316b may be in the range of $1 \times 10^{20}$ to $1 \times 10^{22}$ (atoms/$cm^3$), but the embodiment is not limited thereto.

In addition, as shown in FIG. 19, according to another embodiment, the undoped $Al_tGa_{1-t}N$ layer ($0 \le t<1$) may be the undoped AlGaN-based layer 325, and the second conductive semiconductor layer 316 may be a P type AlGaN-based layer.

For example, the second conductive semiconductor layer 316 may include a first concentration-P type AlGaN-based layer 317a having a first concentration on the undoped AlGaN-based layer 325, and a second concentration-P type AlGaN-based layer 317b having a second concentration higher than the first concentration on the first concentration-P type AlGaN-based layer 317a.

According to the light emitting device of the fifth embodiment, the undoped $Al_tGa_{1-t}N$ layer ($0 \le t<1$) 324 is interposed between the $Al_pGa_qIn_{1-p-q}N$ layer ($0<p \le 1$, $0 \le q \le 1$) 322 and the second conductive semiconductor layer 316, so that the current spreading resulting from the hole spreading can be smoothly performed in the undoped $Al_tGa_{1-t}N$ layer (0≤t<1) 324, so that the yield rate can be improved, and the thermal characteristic can be improved.

In addition, according to the fifth embodiment, the hole mobility is enhanced in the area of the undoped $Al_tGa_{1-t}N$ layer (0≤t<1) 324, so that the luminous intensity (Po) is improved to about 10 mW or more in high current injection area of 500 mA or more.

When the whole thickness of the undoped $Al_tGa_{1-t}N$ layer (0≤t<1) 324, the first concentration-second semiconductor layer 316a, and the second concentration-second conductive semiconductor layer 316b after the $Al_pGa_qIn_{1-p-q}N$ layer (0<p≤1, 0≤q≤1) 322 may be in the range of about 40 nm to about 150 nm, the hole injection efficiency can be increased and the crystal quality can be improved. In more detail, when the whole thickness in the range of about 50 nm to about 100 nm, a greater effect can be produced.

When the whole thickness of the undoped $Al_tGa_{1-t}N$ layer (0≤t<1) 324, the first concentration-second conductive semiconductor layer 316a and the second concentration-second conductive semiconductor layer 316b is less than 40 nm, the light emitting device is disadvantageous to hole concentration. When the whole thickness exceeds 150 nm, the crystal quality may be degraded, and light loss may occur due to the light absorption by p-GaN.

The thickness of the second concentration-second conductive semiconductor layer 316a may be in the range of about 10 nm to about 20 nm. When the thickness is less than 10 nm, the light emitting device is disadvantageous to hole concentration. When the thickness exceeds 20 nm, quality may be degraded and light loss may occur as light is absorbed by p±GaN In addition, when the second concentration-second conductive semiconductor layer 316b having high concentration exceeds 20 nm to be formed with a thick thickness, as P type dopants are heavily doped in order to form the second concentration-second conductive semiconductor layer 316b, point defects or dislocation may cause light absorption.

The occupation ratio of the undoped $Al_tGa_{1-t}N$ layer (0≤t<1) 324 may be 50% or more in the sum of the thicknesses of the undoped $Al_tGa_{1-t}N$ layer (0≤t<1) 324 and the first concentration-second conductive semiconductor layer 316a. For example, the thickness of the undoped $Al_tGa_{1-t}N$ layer (0≤t<1) 324 may be 1.0 or more times the thickness of the first concentration-second conductive semiconductor layer 316a.

When the thickness of the undoped $Al_tGa_{1-t}N$ layer (0≤t<1) 324 may be less than 1.0 times the thickness of the first concentration-second conductive semiconductor layer 316a, the light emitting device is disadvantageous to current spreading, so that the internal light emission efficiency is rapidly reduced as high current is injected. Accordingly, a droop characteristic may be degraded. The droop characteristic may be degraded at the high current of about 500 mA or more.

For example, when the thickness of the undoped $Al_tGa_{1-t}N$ layer (0≤t<1) 324 may be 1.0 to 1.5 times the thickness of the first concentration-second conductive semiconductor layer 316a, the droop characteristic can be remarkably improved. When the thickness ratio of both layers is less than 1.0, the undoped $Al_tGa_{1-t}N$ layer (0≤t<1) 324 has an excessive thin thickness, so that the effect of the current spreading cannot be excellently produced. When the thickness ratio of both layers exceeds 1.5, hole injection is not smoothly performed.

According to the fourth embodiment, although the first conductive semiconductor layer 312 is realized using an N type semiconductor layer, and the second conductive semiconductor layer 316 is realized using the P type semiconductor layer, the embodiment is not limited thereto.

In addition, a semiconductor, for example, an N type semiconductor layer (not shown) having a polarity opposite to a second conductive polarity may be formed on the second conductive semiconductor layer 316. Accordingly, the light emitting structure 310 may be realized in one of an N-P junction structure, a P-N junction structure, an N-P-N junction structure, a P-N-P junction structure.

Thereafter, the transmissive electrode 330 is formed on the second conductive semiconductor layer 316.

For example, the transmissive electrode 330 may include an ohmic layer, and may be formed by stack single metal, a metallic alloy, or a metallic oxide in a multi-layer structure so that hole injection can be efficiently performed.

For example, the transmissive electrode 330 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

Figure 23:
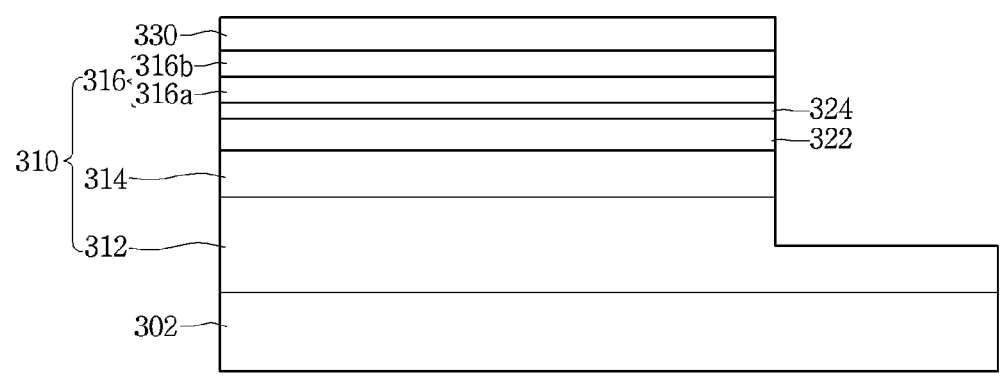

Thereafter, as shown in FIG. 23, portions of the transmissive electrode 330, the second conductive semiconductor layer 316, the undoped $Al_tGa_{1-t}N$ layer (0≤t<1) 324, the $Al_pGa_qIn_{1-p-q}N$ layer (0<p≤1, 0≤q≤1) 322, and the active layer may be removed to expose the first conductive semiconductor layer 312.

Figure 24:
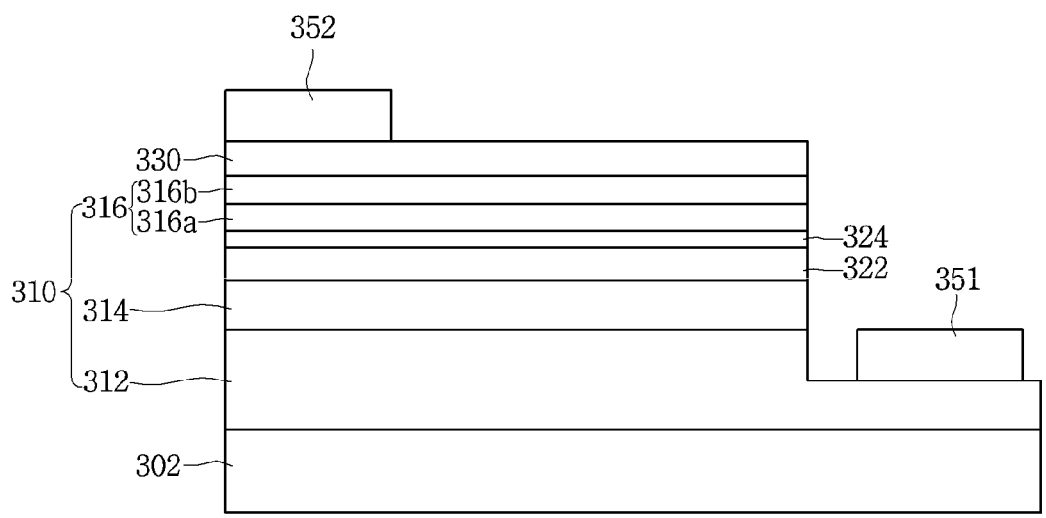

Thereafter, as shown in FIG. 24, the second electrode 352 and the first electrode 351 are formed on the transmissive electrode 330 and an exposed portion of the first conductive semiconductor layer 312, respectively, thereby forming the light emitting device according to the fifth embodiment.

The embodiment can provide a light emitting device capable of overcoming the degradation of the light emission efficiency occurring when injected current is increased, a method of fabricating the same, a light emitting device package, and a lighting system.

For example, according to the light emitting device according to the fifth embodiment, current spreading can be smoothly performed, so that the yield rate and thermal characteristic can be improved.

In addition, according to the fifth embodiment, the hole mobility is enhanced in the undoped $Al_pGa_{1-p}N$ layer, so that the luminous intensity (Po) is improved The light emitting devices according to the first to fifth embodiments may have the same technical feature. For example, the $Al_pGa_qIn_{1-p-q}N$ layer (0<p≤1, 0≤q≤1) may be disposed on the active layer of the light emitting device including the first to third semiconductor layers according to the first embodiment, and the $Al_pGa_qIn_{1-p-q}N$ layer (0<p≤1, 0≤q≤1) may be provided thereon with a superlattice layer and at least one of the undoped $Al_rGa_{1-r}N$ layer (0<r<1) and the P-type $Al_sGa_{1-s}N$ layer (0<s<1).

Figure 25:
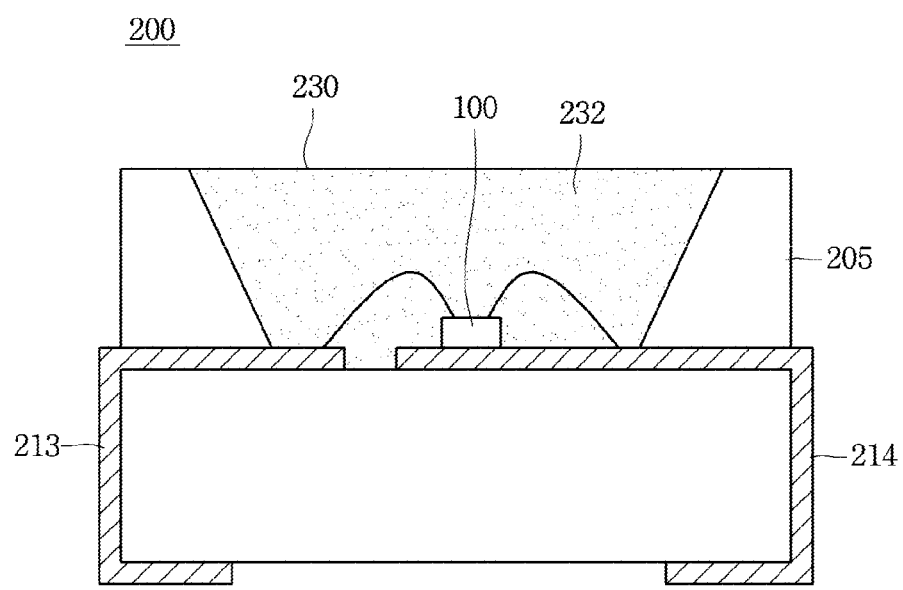
FIG. 25 is a sectional view showing a light emitting device package according to the embodiment.

The light emitting device according to the embodiment may be applied to a backlight unit, a lighting unit, a display device, an indicator, a lamp, a street lamp, a vehicle lighting device, a vehicle display device, a smart clock, and the like, but the embodiment is not limited thereto. FIG. 25 is a view showing a light emitting device package in which the light emitting device according to the embodiments is mounted.

The light emitting device package according to the embodiment may include a package body part 405, a third electrode layer 413 and a fourth electrode layer 414 mounted in the package body part 405, the light emitting device 100 electrically connected with the third and fourth electrode layers, and a molding member 430 to surround the light emitting device 100. The molding member 430 may include a phosphor 432.

The third electrode layer 413 and the fourth electrode layer 414 are electrically insulated from each other to supply power to the light emitting device 100. In addition, the third and fourth electrode layers 413 and 414 reflect light emitted from the light emitting device 100 to improve the light efficiency, and discharge heat emitted from the light emitting device 100 to the outside.

The light emitting device 100 may be electrically connected with the third electrode layer 413 and/or the fourth electrode 414 through one of a wire scheme, a flip-chip scheme, or a die-bonding scheme. The light emitting device 100 may employ at least one of technical features of the first to fourth embodiments shown in FIGS. 1 to 23.

Figure 26:
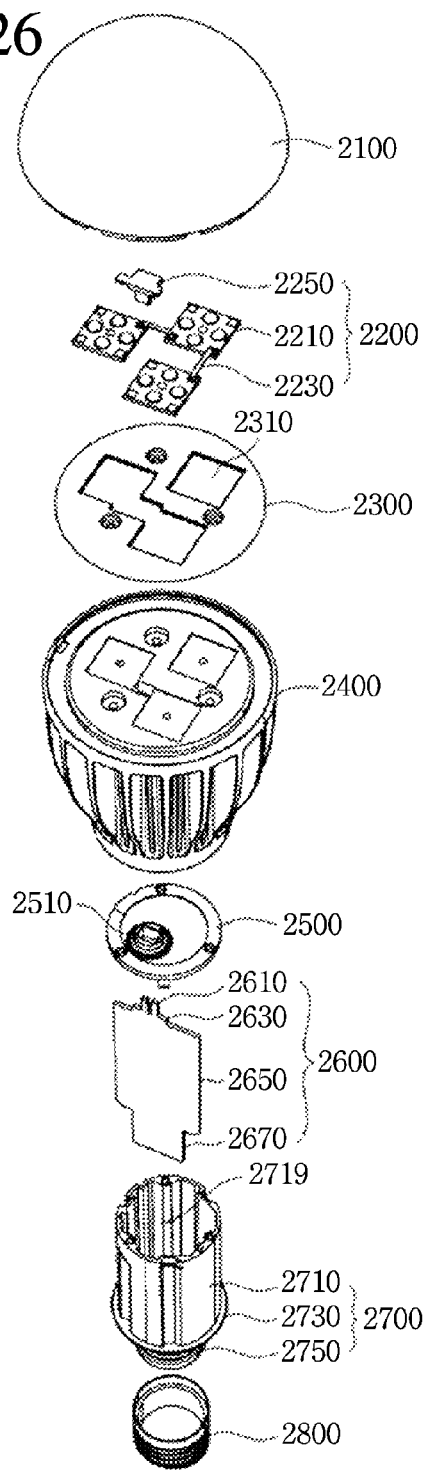
FIG. 26 is an exploded perspective view showing a lighting device according to the embodiment.

FIG. 26 is an exploded perspective of the lighting system according to the embodiment.

The lighting system according to the embodiment may include a cover 2100, a light source module 2200, a heat radiation member 2400, a power supply unit 2600, an internal case 2700, and a socket 2800. The lighting system according to the embodiment may further include at least one of a member 2300 and a holder 2500. The light source module 2200 may include the light emitting device or the light emitting device package according to the embodiment.

The light source module 2200 may include a light source unit 2210, a connection plate 2230, and a connector 2250. The member 2300 is disposed on a top surface of the heat radiation member 2400, and has a guide groove 2310 into which a plurality of light source units 2210 and the connector 2250 are inserted.

The holder 2500 closes a receiving groove 2719 of an insulating part 2710 disposed in the internal case 2700. Accordingly, the power supply unit 2600, which is received in the insulating part 2710 of the internal case 2700, is sealed. The holder 2500 has a guide protrusion part 2510.

The power supply unit 2600 may include a protrusion part 2610, a guide part 2630, a base 2650, and an extension part 2670. The inner case 2700 may include a molding part together with the power supply unit 2600. The molding part is formed by hardening a molding solution to fix the power supply unit 2600 to an inner part of the internal case 2700.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first electrode;
   a first semiconductor layer disposed on the first electrode and including a first conductive dopant;
   a second semiconductor layer disposed on the first semiconductor layer and including the first conductive dopant having a doping concentration lower than a doping concentration of the first semiconductor layer;
   a third semiconductor layer disposed on the second semiconductor layer to adjust stress;
   a first conductive semiconductor layer on the third semiconductor layer;
   an active layer on the first conductive semiconductor layer;
   a second conductive semiconductor layer on the active layer; and
   a second electrode on the second conductive semiconductor layer,
   wherein the third semiconductor layer has a doping concentration in a range between the doping concentration of the second semiconductor layer and a doping concentration of the first conductive semiconductor layer, and the doping concentration of the third semiconductor layer is increased toward the first conductive semiconductor layer, and
   wherein the first conductive semiconductor layer includes the first conductive dopant having a doping concentration higher than a doping concentration of the second semiconductor layer and the third semiconductor layer.

2. The light emitting device of claim 1, wherein the first semiconductor layer comprises a superlattice layer formed by repeatedly stacking GaN and $Al_yGa_{(1-y)}$ ($0 \leq y \leq 1$).

3. The light emitting device of claim 2, wherein the first semiconductor layer further comprises a last layer, and the last layer includes GaN.

4. The light emitting device of claim 3, wherein the last layer has a thickness in a range of 20 nm to 100 nm.

5. The light emitting device of claim 1, wherein the second semiconductor layer comprises $Al_yGa_{(1-y)}N$ ($0 \leq y \leq 1$).

6. The light emitting device of claim 1, wherein the second semiconductor layer has a thickness in a range of 5 nm to 100 nm.

7. The light emitting device of claim 1, wherein a rate of change in the doping concentration of the third semiconductor layer is constant.

8. The light emitting device of claim 1, wherein the doping concentration of the third semiconductor layer is changed stepwise.

9. The light emitting device of claim 1, wherein a rate of change in the doping concentration of the third semiconductor layer is gradually decreased from a lower portion of the third semiconductor layer to an upper portion of the third semiconductor layer.

10. A light emitting device comprising:
    a first conductive semiconductor layer;
    an active layer on the first conductive semiconductor layer;
    an $Al_pGa_qIn_{1-p-q}N$ layer ($0 < p \leq 1$ and $0 \leq q \leq 1$) on the active layer;

an undoped $Al_rGa_{1-r}N$ layer (0<r<1) or an undoped $Al_tGa_{1-t}N$ layer (0≤t<1) on the $Al_pGa_qIn_{1-p-q}N$ layer (0<p≤1 and 0≤q≤1);

a second conductive semiconductor layer on the undoped $Al_rGa_{1-r}N$ layer (0<r<1) or the undoped $Al_tGa_{1-t}N$ layer (0≤t<1); and a P type $Al_sGa_{1-s}N$ layer (0<s<1) disposed between the $Al_pGa_qIn_{1-p-q}N$ layer (0<p≤1 and 0≤q≤1) and the second conductive semiconductor layer.

11. The light emitting device of claim 10, wherein the second conductive semiconductor layer comprises:

a first concentration-second conductive semiconductor layer having a first concentration; and a second concentration-second conductive semiconductor layer formed on the first concentration-second conductive semiconductor layer and having a second concentration higher than the first concentration.

12. The light emitting device of claim 10, wherein the undoped $Al_rGa_{1-r}N$ layer (0<r<1) or the undoped $Al_tGa_{1-t}N$ layer (0≤t<1) comprises an undoped GaN layer.

13. The light emitting device of claim 12, wherein the second conductive semiconductor layer comprises:

a first concentration-P type GaN layer having a first concentration on the undoped GaN layer; and a second concentration-P type GaN layer formed on the first concentration-P type GaN layer and having a second concentration higher than the first concentration.

14. The light emitting device of claim 10, wherein the undoped $Al_rGa_{1-r}N$ layer comprises an undoped AlGaN based layer.

15. The light emitting device of claim 14, wherein the second conductive semiconductor layer comprises:

a first concentration-P type AlGaN based layer having a first concentration on the undoped AlGaN based layer; and a second concentration-P type AlGaN based layer formed on the first concentration-P type AlGaN based layer and having a second concentration higher than the first concentration.

16. The light emitting device of claim 10, wherein the $Al_pGa_qIn_{1-p-q}N$ layer (0<p≤1 and 0≤q≤1) has a thickness in a range of 10 nm to 50 nm.

17. The light emitting device of claim 10, wherein the P type $Al_sGa_{1-s}N$ layer (0<s<1) or the $Al_pGa_qIn_{1-p-q}N$ layer (0<p≤1 and 0≤q≤1) has a thickness in a range of 1 nm to 3 nm.

18. The light emitting device of claim 10, wherein one to five pairs of undoped $Al_rGa_{1-r}N$ layers (0<r<1) and P type $Al_sGa_{1-s}N$ layers (0<s<1) are provided.

19. The light emitting device of claim 10, wherein an aluminum concentration (r) in the undoped $Al_rGa_{1-r}N$ layer (0<r<1) is in a range of 0.04≤r≤0.15.

20. The light emitting device of claim 10, wherein an aluminum concentration (s) of the P type $Al_sGa_{1-s}N$ layer (0<s<1) is in a range of 0.20≤s≤0.35.

* * * * *